(12) United States Patent
Hu et al.

(10) Patent No.: US 11,218,140 B1
(45) Date of Patent: Jan. 4, 2022

(54) CROSS-PHASE DETECTOR BASED PHASE INTERPOLATOR

(71) Applicant: Apple Inc., Cupertino, CA (US)

(72) Inventors: Jiaping Hu, Palo Alto, CA (US); Craig B. Byington, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/003,772

(22) Filed: Aug. 26, 2020

(51) Int. Cl.
| | |
|---|---|
| *H03K 5/135* | (2006.01) |
| *H03K 17/693* | (2006.01) |
| *H03K 3/038* | (2006.01) |
| *H03K 5/00* | (2006.01) |

(52) U.S. Cl.
CPC .............. *H03K 5/135* (2013.01); *H03K 3/038* (2013.01); *H03K 17/693* (2013.01); *H03K 2005/00052* (2013.01)

(58) Field of Classification Search
CPC .... H03K 17/00; H03K 17/164; H03K 17/693; H03K 19/00; H03K 19/0013; H03K 19/00315; H03K 19/00361; H03K 19/018521; H03K 2005/00; H03K 2005/00052; H03K 3/00; H03K 3/038; H03K 5/00; H03K 5/135

USPC .......................................................... 327/112
See application file for complete search history.

(56) References Cited

U.S. PATENT DOCUMENTS

| | | | | |
|---|---|---|---|---|
| 6,160,434 A | * | 12/2000 | Yoshimura | ............... H03K 5/13 327/238 |
| 9,685,141 B2 | | 6/2017 | Song et al. | |
| 10,200,046 B1 | | 2/2019 | Leong et al. | |
| 2015/0221285 A1 | * | 8/2015 | Song | ..................... H03L 7/0812 345/210 |
| 2020/0195240 A1 | | 6/2020 | Lim et al. | |

* cited by examiner

*Primary Examiner* — Lincoln D Donovan
*Assistant Examiner* — Dave Mattison
(74) *Attorney, Agent, or Firm* — Fenwick & West LLP

(57) ABSTRACT

Embodiments relate to a phase interpolator cell. The phase interpolator cell includes a multiplexer configured to select between a first pull-up network and a second pull-up network. The first pull-up network includes a first pull-up transistor controlled by a first clock signal and is connected between a first input of the multiplexer and a first power supply. The second pull-up network includes a second pull-up transistor controlled by a second clock signal and is connected between a second input of the multiplexer and the first power supply.

20 Claims, 14 Drawing Sheets

CROSS-PHASE DETECTOR BASED PHASE INTERPOLATOR

BACKGROUND

1. Field of the Disclosure

The present disclosure relates to a phase interpolator.

2. Description of the Related Art

Phase interpolators are circuits that allows a receiver circuit to adjust the phase of a sampling clock in fine increments. Some phase interpolator architectures use a set of tri-state inverters that are connected to an output node. The tri-state inverters then try to pull the output node up or down based on the value of multiple clock signals provided to the phase interpolator. However, since multiple pull-up networks and pull-down networks are connected to the same node, during certain time periods, the pull-up network from a subset of tri-state inverters and the pull-down network from a second subset of tri-state inverters may be turned on at the same time. This results in a crossbar current forming as a direct path from a first power supply (e.g., VDD) to a second power supply (e.g., VSS or GND) is enabled. The crossbar current introduces non-linearity and jitter to the output clock signal. Moreover, this crossbar current reduces the speed of the phase interpolator circuit.

SUMMARY

Embodiments relate to a phase interpolator cell including a multiplexer that selects between a first pull-up network and a second pull-up network. The first pull-up network includes a first pull-up transistor controlled by a first clock signal and is connected between a first input of the multiplexer and a first power supply. The second pull-up network includes a second pull-up transistor controlled by a second clock signal and is connected between a second input of the multiplexer and the first power supply.

In one or more embodiments, the phase interpolator cell includes a second multiplexer selecting between a first pull-down network and a second pull-down network. The first pull-down network includes a first pull-down transistor controlled by the first clock signal and is connected between a first input of the second multiplexer and a second power supply. The second pull-down network includes a second pull-down transistor controlled by the second clock signal and is connected between a second input of the second multiplexer and the second power supply.

Figure 1:
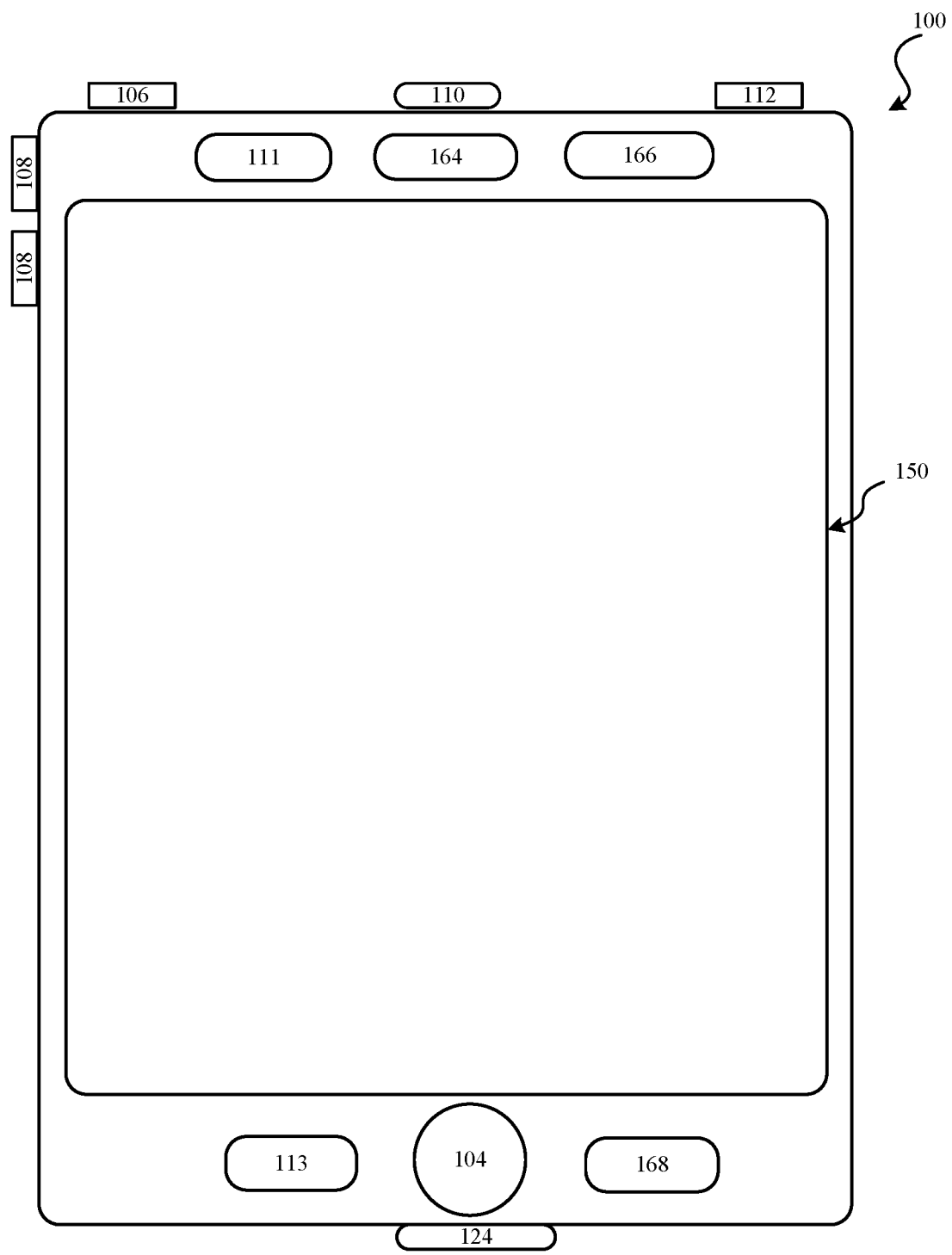
FIG. 1 is a high-level diagram of an electronic device, according to one embodiment.

The figures depict, and the detailed description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to a phase interpolator cell that includes a multiplexer configured to select between a first pull-up network and a second pull-up network. The first pull-up network includes a first pull-up transistor controlled by a first clock signal and is connected between a first input of the multiplexer and a first power supply. The second pull-up network includes a second pull-up transistor controlled by a second clock signal and is connected between a second input of the multiplexer and the first power supply. The phase interpolator cell includes a second multiplexer configured to select between a first pull-down network and a second pull-down network. The first pull-down network includes a first pull-down transistor controlled by the first clock signal and is connected between a first input of the second multiplexer and a second power supply. The second pull-down network includes a second pull-down transistor controlled by the second clock signal and is connected between a second input of the second multiplexer and the second power supply.

Example Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure (FIG. 1 is a high-level diagram of an electronic device 100, according to one embodiment. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. Device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. Device 100 may include more than one type of image sensors 164. Each type may include more than one image sensor 164. For example, one type of image sensors 164 may be cameras and another type of image sensors 164 may be infrared sensors that may be used for face recognition. In addition, or alternatively, image sensors 164 may be associated with different lens configuration. For example, device 100 may include rear image sensors, one with a wide-angle lens and another with as a telephoto lens. Device 100 may include components not shown in FIG. 1 such as an ambient light sensor, a dot projector and a flood illuminator.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). While the components in FIG. 1 are shown as generally located on the same side as touch screen 150, one or more components may also be located on an opposite side of device 100. For example, front side of device 100 may include an infrared image sensor 164 for face recognition and another image sensor 164 as the front camera of device 100. The back side of device 100 may also include additional image sensors 164 as the rear cameras of device 100.

Figure 2:
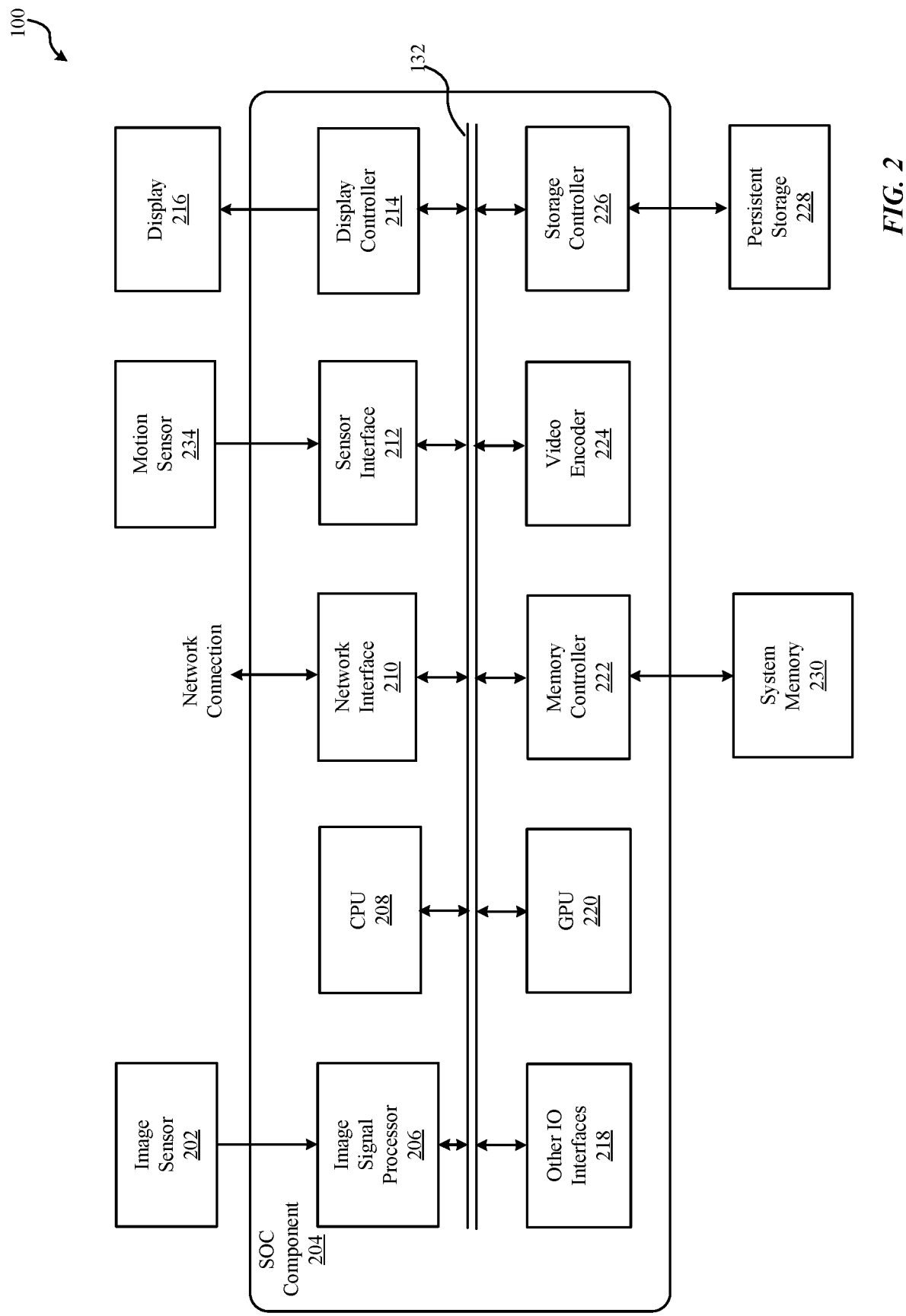
FIG. 2 is a block diagram illustrating components in the electronic device, according to one embodiment.

FIG. 2 is a block diagram illustrating components in device 100, according to one embodiment. Device 100 may perform various operations including implementing one or more machine learning models. For this and other purposes, device 100 may include, among other components, image sensors 202, a system-on-a chip (SOC) component 204, a system memory 230, a persistent storage (e.g., flash memory) 228, a motion sensor 234, and a display 216. The components as illustrated in FIG. 2 are merely illustrative. For example, device 100 may include other components (such as speaker or microphone) that are not illustrated in FIG. 2. Further, some components (such as motion sensor 234) may be omitted from device 100.

Image sensors 202 are components for capturing image data and may be embodied, for example, as a complementary metal-oxide-semiconductor (CMOS) active-pixel sensor, a camera, video camera, or other devices. Image sensors 202 generate raw image data that is sent to SOC component 204 for further processing. In some embodiments, the image data processed by SOC component 204 is displayed on display 216, stored in system memory 230, persistent storage 228 or sent to a remote computing device via network connection. The raw image data generated by image sensors 202 may be in a Bayer color kernel array (CFA) pattern.

Motion sensor 234 is a component or a set of components for sensing motion of device 100. Motion sensor 234 may generate sensor signals indicative of orientation and/or acceleration of device 100. The sensor signals are sent to SOC component 204 for various operations such as turning on device 100 or rotating images displayed on display 216.

Display 216 is a component for displaying images as generated by SOC component 204. Display 216 may include, for example, liquid crystal display (LCD) device or an organic light-emitting diode (OLED) device. Based on data received from SOC component 204, display 116 may display various images, such as menus, selected operating parameters, images captured by image sensors 202 and processed by SOC component 204, and/or other information received from a user interface of device 100 (not shown).

System memory 230 is a component for storing instructions for execution by SOC component 204 and for storing data processed by SOC component 204. System memory 230 may be embodied as any type of memory including, for example, dynamic random access memory (DRAM), synchronous DRAM (SDRAM), double data rate (DDR, DDR2, DDR3, etc.) RAMBUS DRAM (RDRAM), static RAM (SRAM) or a combination thereof.

Persistent storage 228 is a component for storing data in a non-volatile manner. Persistent storage 228 retains data even when power is not available. Persistent storage 228 may be embodied as read-only memory (ROM), flash memory or other non-volatile random access memory devices. Persistent storage 228 stores an operating system of device 100 and various software applications. Persistent storage 228 may also store one or more machine learning models, such as regression models, random forest models, support vector machines (SVMs) such as kernel SVMs, and artificial neural networks (ANNs) such as convolutional network networks (CNNs), recurrent network networks (RNNs), autoencoders, and long short term memory (LSTM). A machine learning model may be an independent model that works with the neural processor circuit 218 and various software applications or sensors of device 100. A machine learning model may also be part of a software application. The machine learning models may perform various tasks such as facial recognition, image classification, object, concept, and information classification, speech recognition, machine translation, voice recognition, voice command recognition, text recognition, text and context analysis, other natural language processing, predictions, and recommendations.

Various machine learning models stored in device 100 may be fully trained, untrained, or partially trained to allow device 100 to reinforce or continue to train the machine learning models as device 100 is used. Operations of the machine learning models include various computation used in training the models and determining results in runtime using the models. For example, in one case, device 100 captures facial images of the user and uses the images to continue to improve a machine learning model that is used to lock or unlock the device 100.

SOC component 204 is embodied as one or more integrated circuit (IC) chip and performs various data processing processes. SOC component 204 may include, among other subcomponents, image signal processor (ISP) 206, a central processor unit (CPU) 208, a network interface 210, sensor interface 212, display controller 214, neural processor circuit 218, graphics processor (GPU) 220, memory controller 222, video encoder 224, storage controller 226, and bus 232 connecting these subcomponents. SOC component 204 may include more or fewer subcomponents than those shown in FIG. 2.

ISP 206 is a circuit that performs various stages of an image processing pipeline. In some embodiments, ISP 206 may receive raw image data from image sensors 202, and process the raw image data into a form that is usable by other subcomponents of SOC component 204 or components of device 100. ISP 206 may perform various image-manipulation operations such as image translation operations, horizontal and vertical scaling, color space conversion and/or image stabilization transformations.

CPU 208 may be embodied using any suitable instruction set architecture, and may be configured to execute instructions defined in that instruction set architecture. CPU 208 may be general-purpose or embedded processors using any of a variety of instruction set architectures (ISAs), such as the x86, PowerPC, SPARC, RISC, ARM or MIPS ISAs, or any other suitable ISA. Although a single CPU is illustrated in FIG. 2, SOC component 204 may include multiple CPUs. In multiprocessor systems, each of the CPUs may commonly, but not necessarily, implement the same ISA.

Graphics processing unit (GPU) 220 is graphics processing circuitry for performing graphical data. For example, GPU 220 may render objects to be displayed into a frame buffer (e.g., one that includes pixel data for an entire frame). GPU 220 may include one or more graphics processors that may execute graphics software to perform a part or all of the graphics operation, or hardware acceleration of certain graphics operations.

Neural processor circuit 218 is a circuit that performs various machine learning operations based on computation including multiplication, addition, and accumulation. Such computation may be arranged to perform, for example, various types of tensor multiplications such as tensor product and convolution of input data and kernel data. Neural processor circuit 218 is a configurable circuit that performs these operations in a fast and power-efficient manner while relieving CPU 208 of resource-intensive operations associated with neural network operations. Neural processor circuit 218 may receive the input data from sensor interface 212, the image signal processor 206, persistent storage 228, system memory 230 or other sources such as network interface 210 or GPU 220. The output of neural processor circuit 218 may be provided to various components of device 100 such as image signal processor 206, system memory 230 or CPU 208 for various operations. The structure and operation of neural processor circuit 218 are described below in detail with reference to FIG. 3.

Network interface 210 is a subcomponent that enables data to be exchanged between devices 100 and other devices via one or more networks (e.g., carrier or agent devices). For example, video or other image data may be received from other devices via network interface 210 and be stored in system memory 230 for subsequent processing (e.g., via a back-end interface to image signal processor 206) and display. The networks may include, but are not limited to, Local Area Networks (LANs) (e.g., an Ethernet or corporate network) and Wide Area Networks (WANs). The image data received via network interface 210 may undergo image processing processes by ISP 206.

Sensor interface 212 is circuitry for interfacing with motion sensor 234. Sensor interface 212 receives sensor information from motion sensor 234 and processes the sensor information to determine the orientation or movement of device 100.

Display controller 214 is circuitry for sending image data to be displayed on display 216. Display controller 214 receives the image data from ISP 206, CPU 208, graphic processor or system memory 230 and processes the image data into a format suitable for display on display 216.

Memory controller 222 is circuitry for communicating with system memory 230. Memory controller 222 may read data from system memory 230 for processing by ISP 206, CPU 208, GPU 220 or other subcomponents of SOC component 204. Memory controller 222 may also write data to system memory 230 received from various subcomponents of SOC component 204.

Video encoder 224 is hardware, software, firmware or a combination thereof for encoding video data into a format suitable for storing in persistent storage 128 or for passing the data to network interface w10 for transmission over a network to another device.

In some embodiments, one or more subcomponents of SOC component 204 or some functionality of these subcomponents may be performed by software components executed on neural processor circuit 218, ISP 206, CPU 208 or GPU 220. Such software components may be stored in system memory 230, persistent storage 228 or another device communicating with device 100 via network interface 210.

Image data or video data may flow through various data paths within SOC component 204. In one example, raw image data may be generated from image sensors 202 and processed by ISP 206, and then sent to system memory 230 via bus 232 and memory controller 222. After the image data is stored in system memory 230, it may be accessed by video encoder 224 for encoding or by display 216 for displaying via bus 232.

In another example, image data is received from sources other than image sensors 202. For example, video data may be streamed, downloaded, or otherwise communicated to the SOC component 204 via wired or wireless network. The image data may be received via network interface 210 and written to system memory 230 via memory controller 222. The image data may then be obtained by ISP 206 from system memory 230 and processed through one or more image processing pipeline stages. The image data may then be returned to system memory 230 or be sent to video encoder 224, display controller 214 (for display on display 216), or storage controller 226 for storage at persistent storage 228.

Cross Phase Detector (XPD) Phase Interpolator

Figure 3:
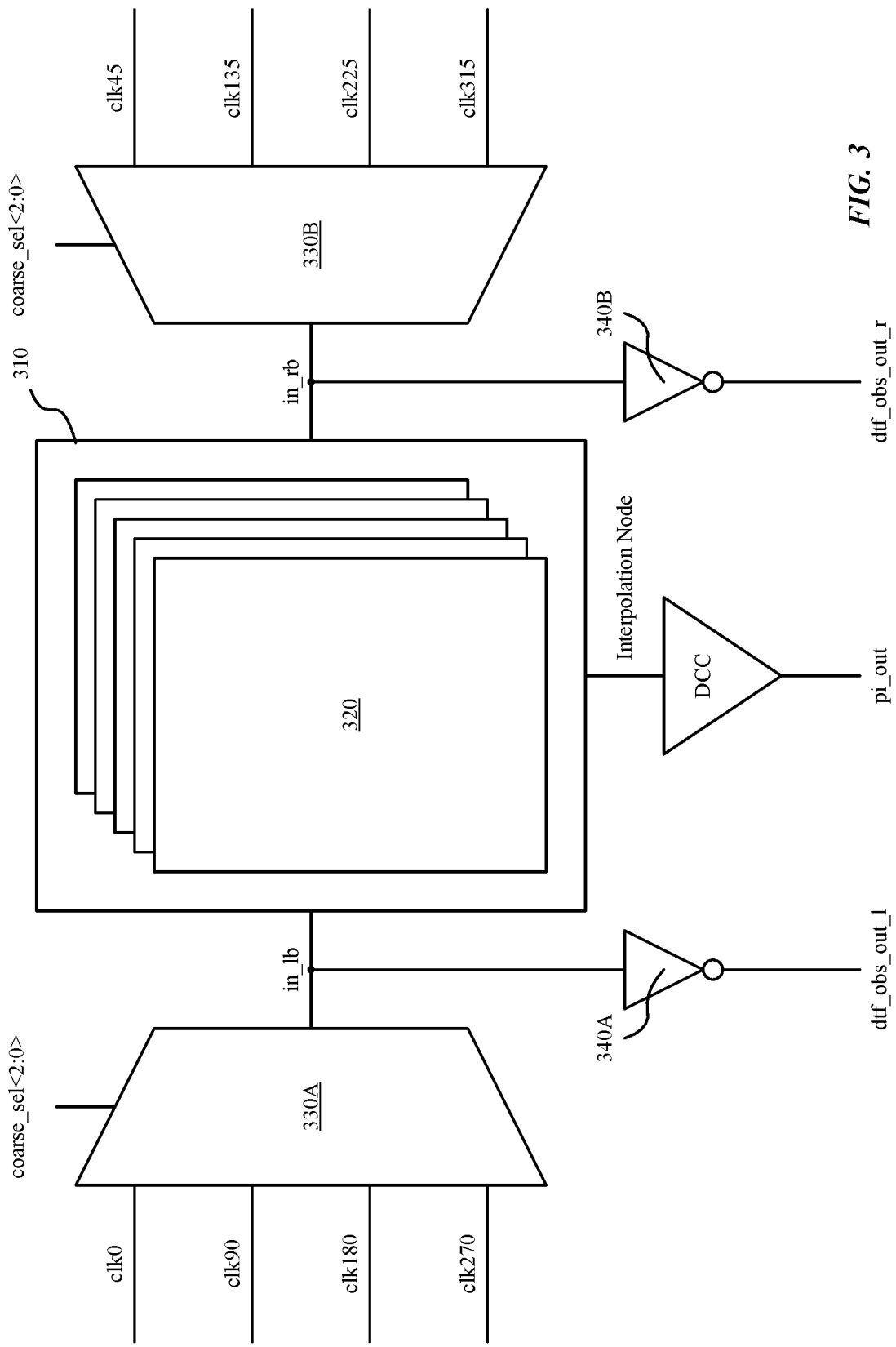
FIG. 3 is a block diagram illustrating a cross phase detector (XPD) phase interpolator architecture, according to one embodiment.

FIG. 3 is a block diagram illustrating a cross phase detector (XPD) phase interpolator architecture, according to one embodiment. The phase interpolator architecture includes a phase interpolator 310 includes multiple phase interpolator cells 320 connected in parallel. The phase interpellator has a first input receiving a clock signal in_lb and a second input receiving a second clock signal in_rb. The first clock signal is provided by a multiplexer 330A. The multiplexer 330A selects one of multiple clock signals clk0, clk90, clk180, clk270 based on a coarse selection signal coarse_sel<2:0>. The second clock signal is provided by a multiplexer 330B. The multiplexer 330B selects one of multiple clock signals clk45, clk135, clk225, clk315 based on a coarse selection signal coarse_sel<2:0>.

The XPD phase interpolator architecture includes a duty cycle corrector (DCC) that corrects the duty cycle at the output of the XPD interpolator 310. As such, the XPD phase interpolator architecture of FIG. 3 is able to do both phase interpolation and duty cycle correction.

In some embodiments, the XPD phase interpolator architecture further includes polarity correction inverters or buffers 340. The polarity correction inverters or buffers 340 allow for testing of the XPD phase interpolator by allowing the observability of the clocks being provided to the XPD phase interpolator.

Figure 4A:
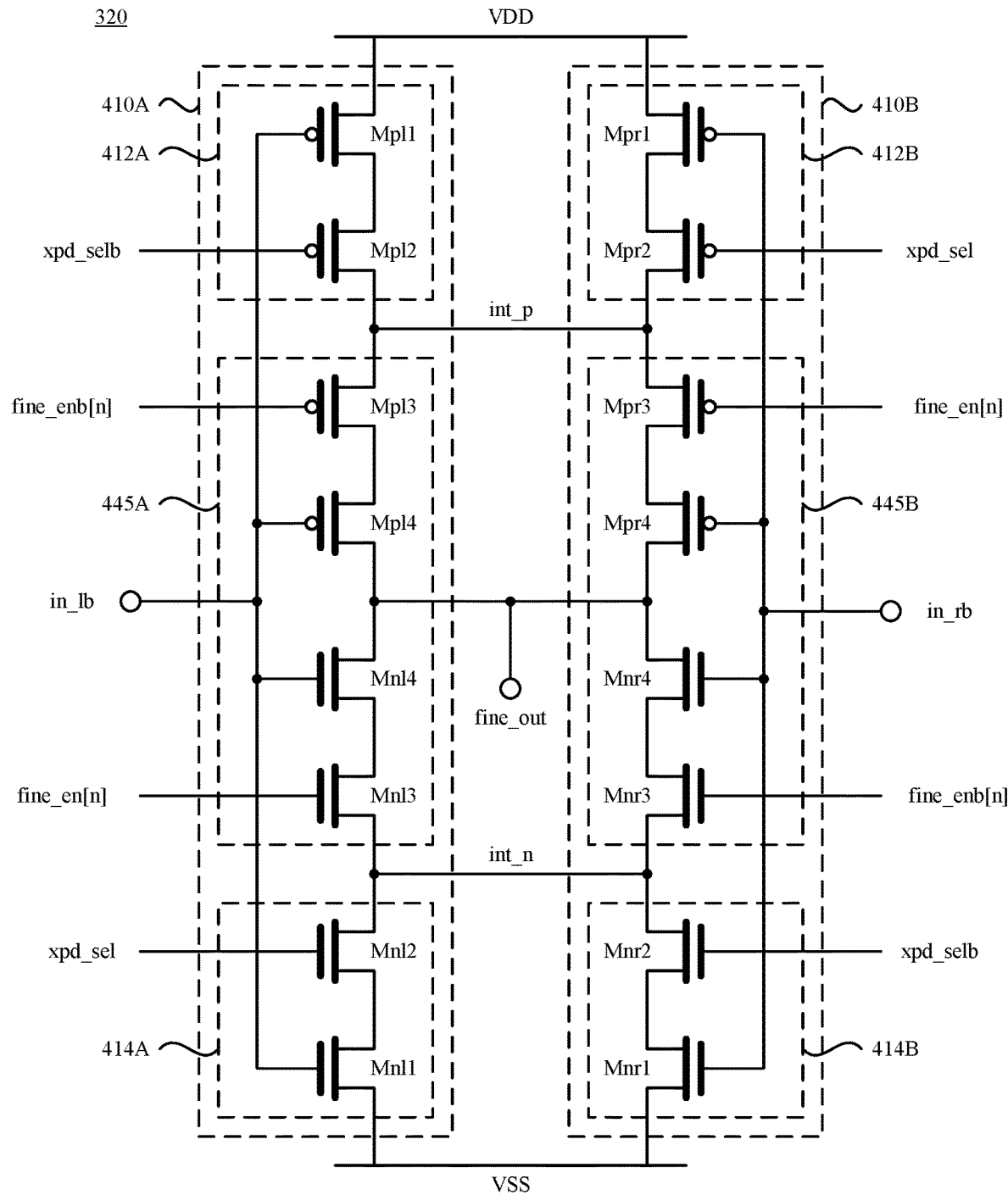
FIG. 4A is a schematic diagram of a phase interpolator cell, according to one embodiment.

FIG. 4A is a schematic diagram of a phase interpolator cell, according to one embodiment. The phase interpolator cell 320 includes two branches 410. Each of branches 410A, 410B includes multiple transistors. In the example of FIG. 4A, each of branches 410A, 410B has eight transistors. In particular, each branch 410 has four pull-down transistors and four pull-up transistors.

The left branch 410A has four pull-down transistors Mnl1 through Mnl4. The first pull-down transistor Mnl1 and the fourth pull-down transistor Mnl4 receive as an input a first clock signal in_lb. The second pull-down transistor Mnl2 is connected in series with the first pull-down transistor Mnl1 and receives as an input a first select signal xpd_sel. The third pull-down transistor Mnl3 is connected in series with the fourth pull-down transistor Mnl4 and receives as an input a first enable signal fine_en[n].

Moreover, the left branch 410A has four pull-up transistors Mpl1 through Mpl4. The first pull-up transistor Mpl1 and the fourth pull-up transistor Mpl4 receive as an input the first clock signal in_lb. The second pull-up transistor Mpl2 is connected in series with the first pull-up transistor Mpl1 and receives as an input a second select signal xpd_selb. In some embodiments, the second select signal xpd_selb is an inverse of the first select signal xpd_sel. That is, the second select signal xpd_selb may be generated by inverting the first select signal xpd_sel. The third pull-up transistor Mpl3 is connected in series with the fourth pull-up transistor Mpl4 and receives as an input a second enable signal fine_enb[n]. In some embodiments, the second enable signal fine_enb[n] is an inverse of the first enable signal fine_en[n]. That is, the second enable signal fine_enb[n] may be generated by inverting the first enable signal fine_en[n].

The first select signal xpd_sel and the second select signal xpd_selb are generated based on the coarse_sel signal. In particular, the first select signal xpd_sel is generated to have a first logic level when the first clock signal in_lb selected by the coarse_sel signal leads the second clock signal in_rb selected by the coarse_sel signal. Moreover, the first select signal xpd_sel is generated to have a second logic level when the second clock signal in_rb selected by the coarse_sel signal leads the first clock signal in_lb selected by the coarse_sel signal. For example, the first select signal xpd_sel is controlled to have an active value (e.g., a high logic level) when the coarse_sel signal indicates that the first clock signal in_lb will lead the second clock signal in_rb (i.e., the second clock signal in_rb will lag the first clock signal in_lb). Moreover, the first select signal xpd_sel is controlled to have an inactive value (e.g., a low logic level) when the coarse_sel signal indicates that the second clock signal in_rb will lead the first clock signal in_lb (i.e., the first clock signal in_lb will lag the second clock signal in_rb). In some embodiments, the XPD phase interpolator architecture includes a control circuit that generates the first select signal xpd_sel and the second select signal xpd_selb based on the value of the coarse_sel signal.

When the first enable signal fine_en[n] is asserted and the second enable signal fine_enb[n] is not asserted, the third pull-down transistor Mnl3 and the third pull-up transistor Mpl3 are turned on. When the third pull-down transistor Mnl3 and the third pull-up transistor Mpl3 are turned on the fourth pull-up transistor Mpl4 and the fourth pull-down transistor Mnl4 form an inverter that receives as an input the first clock signal in_lb. That is, the combination of the third pull-down transistor Mnr3, the fourth pull-up transistor Mnr4, the third pull-up transistor Mpr3, and the fourth pull-up transistor Mpr4 form a first tri-state inverter. The first tri-state inverter inverts the first clock signal in_lb when the first enable signal fine_en[n] is asserted, and has a floating output or a high impedance output when the first enable signal fine_en[n] is not asserted.

The right branch 410B has four pull-down transistors Mnr1 through Mnr4. The first pull-down transistor Mnr1 and the fourth pull-down transistor Mnr4 receive as an input a second clock signal in_rb. The second pull-down transistor Mnr2 is connected in series with the first pull-down transistor Mnr1 and receives as an input the second select signal xpd_selb. The third pull-down transistor Mnr3 is connected in series with the fourth pull-down transistor Mnr4 and receives as an input the second enable signal fine_enb[n].

Moreover, the right branch 410B has four pull-up transistors Mpr1 through Mpr4. The first pull-up transistor Mpr1 and the fourth pull-up transistor Mpr4 receive as an input the second clock signal in_rb. The second pull-up transistor Mpr2 is connected in series with the first pull-up transistor Mpr1 and receives as an input the first select signal xpd_sel. The third pull-up transistor Mpr3 is connected in series with the fourth pull-up transistor Mpr4 and receives as an input the first enable signal fine_en[n].

When the first enable signal fine_en[n] is not asserted and the second enable signal fine_enb[n] is asserted, the third pull-down transistor Mnr3 and the third pull-up transistor Mpr3 are turned on. When the third pull-down transistor Mnr3 and the third pull-up transistor Mpr3 are turned on the fourth pull-up transistor Mpr4 and the fourth pull-down transistor Mnr4 form an inverter that receives as an input the second clock signal in_rb. That is, the combination of the third pull-down transistor Mnr3, the fourth pull-up transistor Mnr4, the third pull-up transistor Mpr3, and the fourth pull-up transistor Mpr4 form a second tri-state inverter. The second tri-state inverter inverts the second clock signal in_rb when the second enable signal fine_enb[n] is asserted, and has a floating output or a high impedance output when the second enable signal fine_enb[n] is not asserted. Since the second enable signal fine_enb[n] is the inverse of the first enable signal fine_en[n], only one between the first tri-state inverter and the second tri-state inverter is enabled.

The series combination of the first pull-up transistor Mpl1 and the second pull-up transistor Mpl2 of the left branch 410A is connected in parallel to the series combination of the first pull-up transistor Mpr1 and the second pull-up transistor Mpr2 of the right branch 410B. When the first enable signal xpd_sel has an active value, the series combination of the first pull-up transistor Mpr1 and the second pull-up transistor Mpr2 of the right branch 410B is turned off. Conversely, when the second enable signal xpd_selb has an active value, the series combination of the first pull-up transistor Mpl1 and the second pull-up transistor Mpl2 of the left branch 410A is turned off.

The series combination of the first pull-up transistor Mpl1 and the second pull-up transistor Mpl2 of the left branch 410A form a first pull-up network 412A that controls when the first tri-state inverter 445A and the second-tri-state inverter 445B are connected to a first power supply VDD. Similarly, the series combination of the first pull-up transistor Mpr1 and the second pull-up transistor Mpr2 of the right branch 410B form a second pull-up network 412B that controls when the first tri-state inverter 445A and the second-tri-state inverter 445B are connected to the first power supply VDD. Since the first pull-up network 412A is enabled by the first select signal xpd_sel has an active value (i.e., when the second select signal xpd_selb has an inactive value) and the second pull-up network 412B is enabled when the second select signal xpd_selb has an active value (i.e., when the first select signal xpd_sel has an inactive value), only one of the two pull-up networks 412 is active at a given time.

When the first pull-up network 412A is turned on, the first pull-up network 412A connects the first tri-state inverter 445A and the second tri-state inverter 445B to the first power supply VDD when the first clock signal in_lb has a low logic level (LO). Moreover, when the first pull-up network 412A is turned on, the first pull-up network 412A disconnects the first tri-state inverter 445A and the second tri-state inverter 445B from the first power supply VDD when the first clock signal in_lb has a high logic level (HI).

Similarly, when the second pull-up network 412B is turned on, the second pull-up network 412B connects the first tri-state inverter 445A and the second tri-state inverter 445B to the first power supply VDD when the second clock signal in_rb has a low logic level (LO). Moreover, when the second pull-up network 412B is turned on, the second pull-up network 412B disconnects the first tri-state inverter 445A and the second tri-state inverter 445B from the first power supply VDD when the second clock signal in_rb has a high logic level (HI).

The series combination of the first pull-down transistor Mnl1 and the second pull-down transistor Mnl2 of the left branch 410A form a first pull-down network 414A that controls when the first tri-state inverter 445A and the second-tri-state inverter 445B are connected to a second power supply VSS. Similarly, the series combination of the first pull-down transistor Mnr1 and the second pull-down transistor Mnr2 of the right branch 410B form a second pull-down network 414B that controls when the first tri-state inverter 445A and the second-tri-state inverter 445B are connected to the second power supply VSS. Since the first pull-down network 414A is enabled by the first select signal xpd_sel has an active value (i.e., when the second select signal xpd_selb has an inactive value) and the second pull-down network 414B is enabled when the second select signal xpd_selb has an active value (i.e., when the first select signal xpd_sel has an inactive value), only one of the two pull-down networks 414 is active at a given time.

When the first pull-down network 414A is turned on, the first pull-down network 414A connects the first tri-state inverter 445A and the second tri-state inverter 445B to the second power supply VSS when the first clock signal in_lb has a high logic level (HI). Moreover, when the first pull-down network 414A is turned on, the first pull-down network 414A disconnects the first tri-state inverter 445A and the second tri-state inverter 445B from the second power supply VSS when the first clock signal in_lb has a low logic level (LO).

Similarly, when the second pull-down network 414B is turned on, the second pull-down network 414B connects the first tri-state inverter 445A and the second tri-state inverter 445B to the second power supply VSS when the second clock signal in_rb has a high logic level (HI). Moreover, when the second pull-down network 414B is turned on, the second pull-down network 414B disconnects the first tri-state inverter 445A and the second tri-state inverter 445B from the second power supply VSS when the second clock signal in_rb has a low logic level (LO).

Figure 4B:
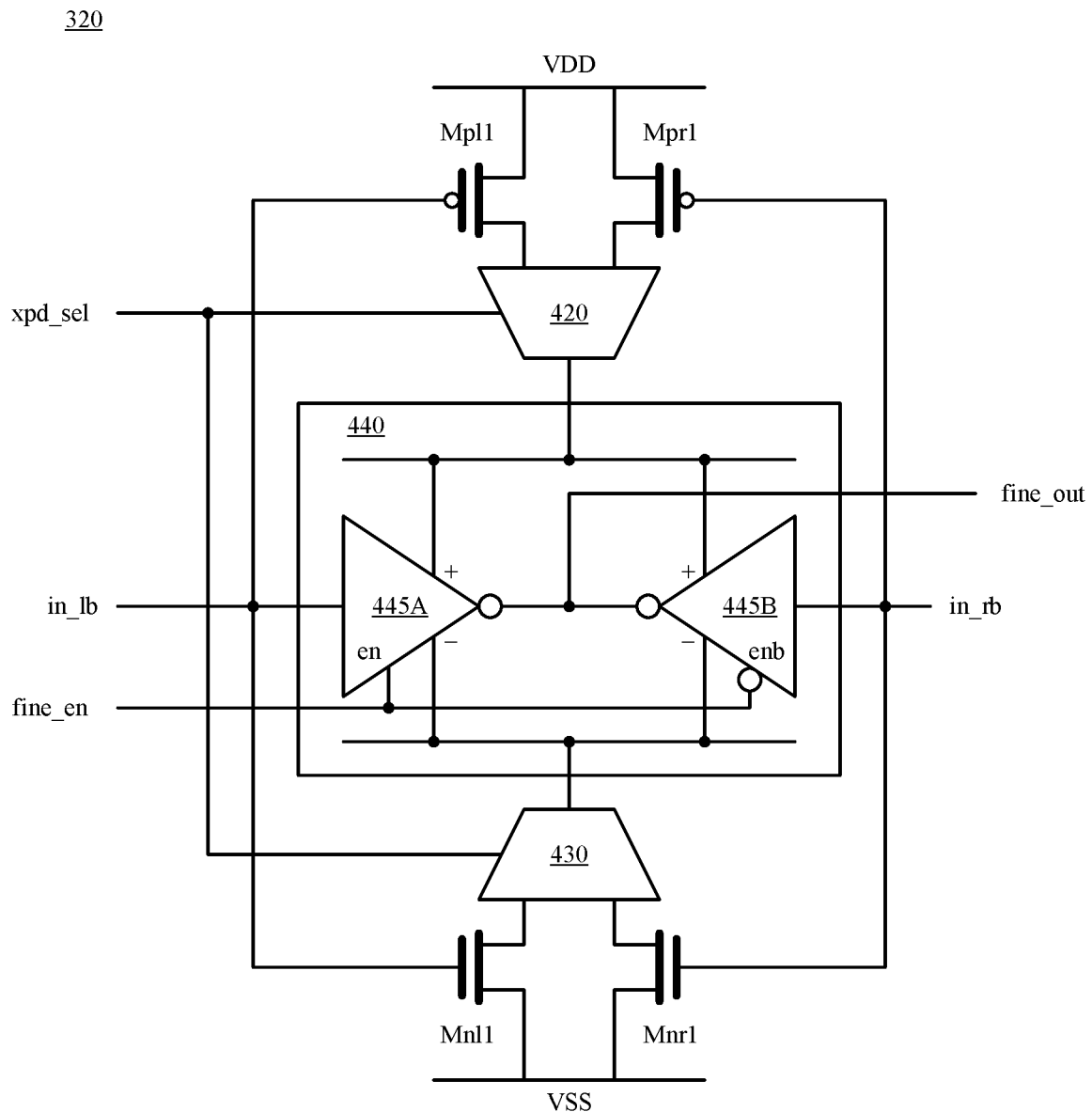
FIG. 4B is a block diagram of a phase interpolator cell of FIG. 4A, according to one embodiment.

FIG. 4B is a block diagram of a phase interpolator cell of FIG. 4A, according to one embodiment. The phase interpolator includes a tri-state inverter pair 440, a first multiplexer 420, a left pull-up transistor Mpl1, a right pull-up transistor Mpr1, a second multiplexer 430, a left pull-down transistor Mnl1, and a right pull-down transistor Mnr1.

The tri-state inverter pair 440 includes a left tri-state inverter 445A and a right tri-state inverter 445B. The left tri-state inverter 445A receives as an input the first clock signal in_lb. The right tri-state inverter 445B receives as an input the second clock signal in_rb. Moreover, the output of the left tri-state inverter 445A is connected to the output of the right tri-state inverter 445B.

The tri-state inverter pair 440 is configured such that the left tri-state inverter 445A is enabled when the first enable signal fine_en is asserted, and the right tri-state inverter 445B is enabled when the first enable signal fine_en is not asserted (i.e., when the second enable signal fine_enb is asserted). A more detailed description of a tri-state inverter 445 is provided below in conjunction with FIG. 4C.

The output of the first multiplexer 420 is connected to a first power supply input of the tri-state inverter pair 440. The first multiplexer 420 includes two inputs. The first input of the first multiplexer 420 is connected to the left pull-up transistor Mph 1. The second input of the first multiplexer 420 is connected to the right pull-up transistor Mpr1. A more detailed description of the first multiplexer 420 is provided below in conjunction with FIG. 4D.

The left pull-up transistor Mpl1 is a switch that receives as a control signal the first clock signal in_lb. When the first clock signal in_lb has a low logic level, the left pull-up transistor Mpl1 connects the first input of the first multiplexer to the first power supply VDD. When the first clock signal in_lb has a high logic level, the left pull-up transistor Mpl1 disconnects the first input of the first multiplexer from the first power supply VDD.

The right pull-up transistor Mpr1 is a switch that receives as a control signal the second clock signal in_rb. When the second clock signal in_rb has a low logic level, the right pull-up transistor Mpr1 connects the second input of the first multiplexer to the first power supply VDD. When the second clock signal in_rb has a high logic level, the right pull-up transistor Mpr1 disconnects the second input of the first multiplexer from the first power supply VDD.

The output of the second multiplexer 430 is connected to a second power supply input of the tri-state inverter pair 440. The second multiplexer 430 includes two inputs. The first input of the second multiplexer 430 is connected to the left pull-down transistor Mnl1. The second input of the second multiplexer 430 is connected to the right pull-down transistor Mnr1. A more detailed description of the second multiplexer 430 is provided below in conjunction with FIG. 4E.

The left pull-down transistor Mnl1 is a switch that receives as a control signal the first clock signal in_lb. When the first clock signal in_lb has a high logic level, the left pull-down transistor Mnl1 connects the first input of the second multiplexer to the second power supply VSS. When the first clock signal in_lb has a low logic level, the left pull-down transistor Mnl1 disconnects the first input of the first multiplexer from the second power supply VSS.

The right pull-down transistor Mnr1 is a switch that receives as a control signal the second clock signal in_rb. When the second clock signal in_rb has a high logic level, the right pull-down transistor Mnr1 connects the second input of the second multiplexer to the second power supply VSS. When the second clock signal in_rb has a low logic level, the right pull-down transistor Mnr1 disconnects the second input of the second multiplexer from the second power supply VSS.

The first and second multiplexers are configured to receive as a control input a select signal xpd_sel. When the select signal xpd_sel has a first value (e.g., a high logic level), the first multiplexer 420 is configured to connect the first input of the first multiplexer 420 to the output of the first multiplexer 420. Similarly, when the select signal xpd_sel has the first value (e.g., a high logic level), the second multiplexer 430 is configured to connect the first input of the second multiplexer 430 to the output of the second multiplexer 430.

Moreover, when the select signal xpd_sel has a second value (e.g., a low logic level), the first multiplexer 420 is configured to connect the second input of the first multiplexer 420 to the output of the first multiplexer 420. Similarly, when the select signal xpd_sel has the second value (e.g., a low logic level), the second multiplexer 430 is configured to connect the second input of the second multiplexer 430 to the output of the second multiplexer 430.

Figure 4C:
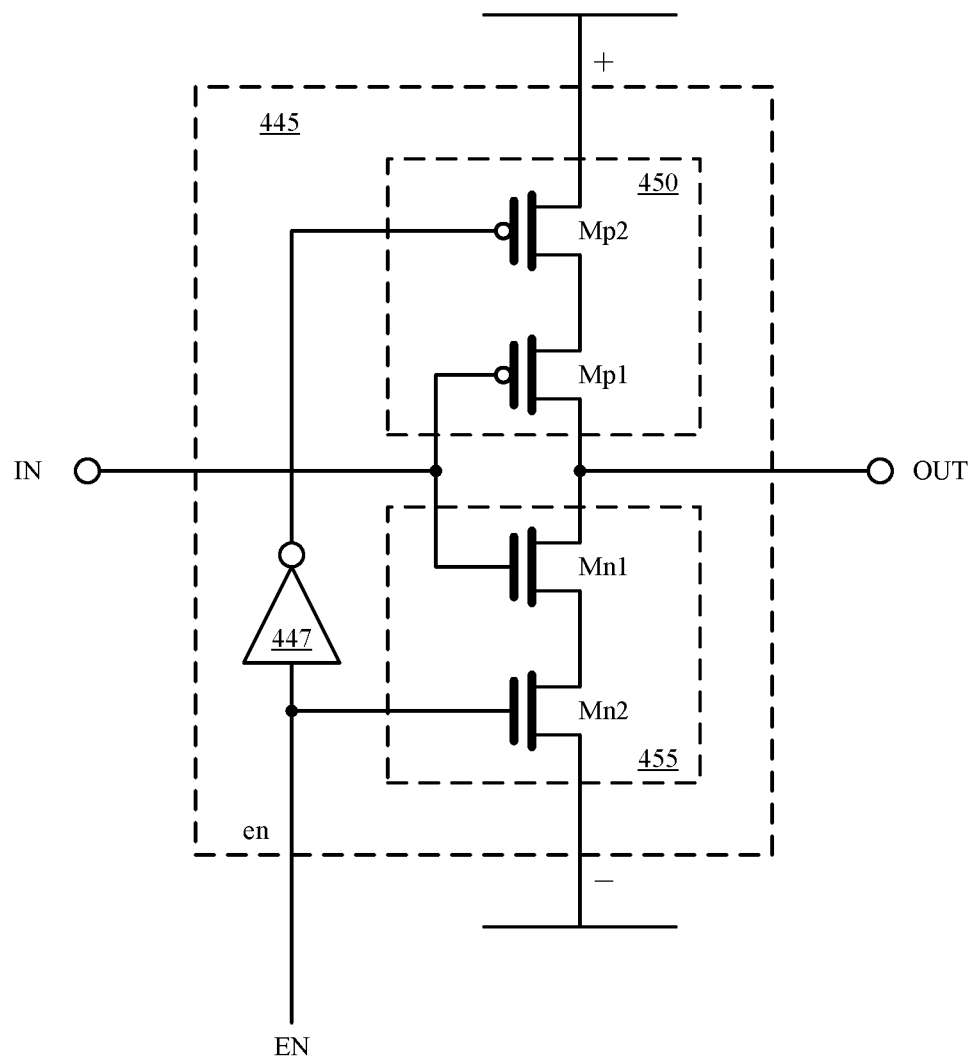
FIG. 4C is a schematic diagram of a tri-state inverter used in a phase interpolator cell, according to one embodiment.

FIG. 4C is a schematic diagram of a tri-state inverter used in a phase interpolator cell, according to one embodiment. The tri-state inverter 445 includes a pull-up network 450 and a pull-down network 455. The pull-up network 450 includes a first pull-up transistor Mp1 and a second pull-up transistor Mp2. Moreover, the pull-down network 455 includes a first pull-down transistor Mn1 and a second pull-down transistor Mn2. In some embodiments, the first pull-up transistor Mp1 and the first pull-down transistor Mn1 are connected in an inverter configuration. That is, the gate of the first pull-up transistor Mp1 and the gate of the pull-down transistor Mn1 are connected to an input signal IN. the input signal IN may be the first clock signal in_lb or the second clock signal in_rb. Moreover, the drain of the first pull-up transistor Mp1 is connected to the drain of the first pull-down transistor Mn1.

The second pull-up transistor Mp2 is coupled in series to the first pull-up transistor Mp1. The second pull-down transistor Mn2 is coupled in series to the first pull-down transistor Mn1. The second pull-down transistor Mn2 receives as an input an enable signal EN, and the first pull-up transistor Mp2 receives as an input an inverse of the enable signal EN. The enable signal EN may be the first enable signal fine_en[n] or the second enable signal fine_enb[n].

In some embodiments, the tri-state inverter 445 includes an inverter 447. Inverter 447 receives the enable signal EN and generates the inverse of the enable signal. In other embodiments, the tri-state inverter 445 is configured to receive both the enable signal as a first enable input and the inverse of the enable signal as a second enable input.

Figure 4D:
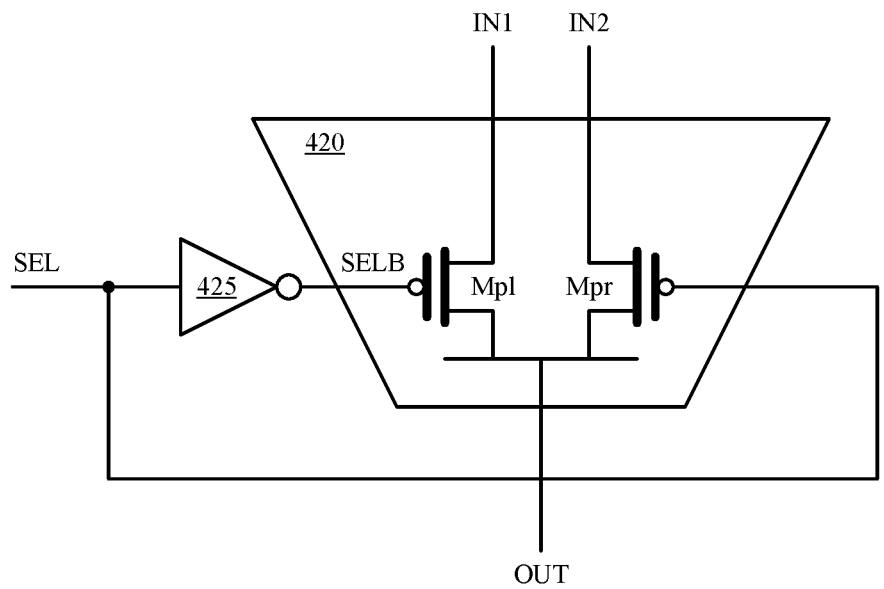
FIG. 4D is a schematic diagram of a first multiplexer used in a phase interpolator cell, according to one embodiment.

FIG. 4D is a schematic diagram of a first multiplexer used in a phase interpolator cell, according to one embodiment. The first multiplexer 420 selects one of two inputs and couples the selected input to the output. In the embodiment shown in FIG. 4D, the first multiplexer 420 is designed to pull up the output node OUT via the first input IN1 or the second input IN2. The first multiplexer 420 includes a left pull-up transistor Mpl and a right pull-up transistor Mpr. The drain of the left pull-up transistor Mpl and the drain of the right pull-up transistor Mpr are connected to the output node OUT. Moreover, the source of the left pull-up transistor Mpl is coupled to the first input IN1 and the source of the right pull-up transistor Mpr is coupled to the second input IN2. The right pull-up transistor Mpr receives as a control input a select signal SEL. The left pull-up transistor Mpl receives as a control input an inverse of the select signal SELB. In some embodiments, the first multiplexer 420 includes an inverter 425 to generate the inverse of the select signal SELB. In other embodiments, the first multiplexer 420 is configured to receive both the select signal SEL and the inverse of the select signal SELB. In some embodiments, the select signal SEL is the first select signal xpd_sel and the inverse of the select signal SELB is the second select signal xpd_selb.

Figure 4E:
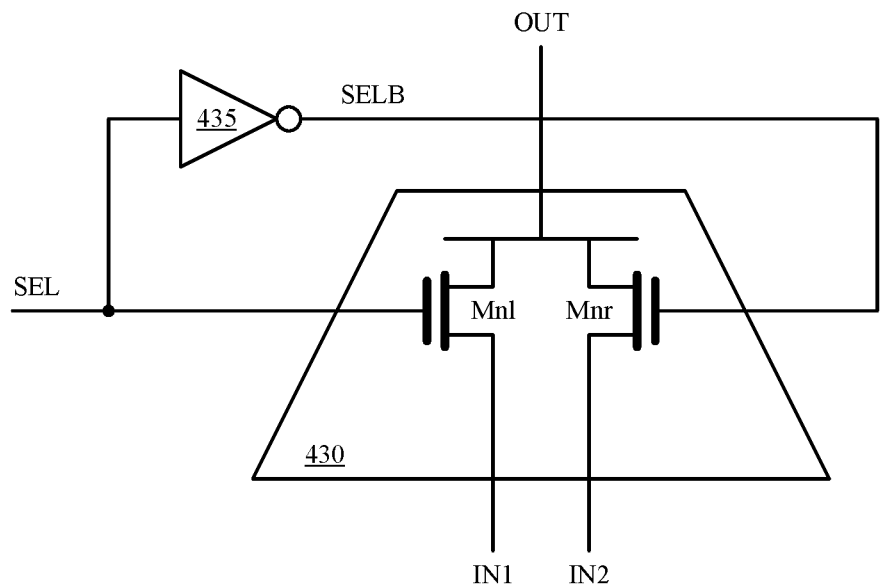
FIG. 4E is a schematic diagram of a second multiplexer used in a phase interpolator cell, according to one embodiment.

FIG. 4E is a schematic diagram of a second multiplexer used in a phase interpolator cell, according to one embodiment. The second multiplexer 430 selects one of two inputs and couples the selected input to the output. In the embodiment shown in FIG. 4E, the second multiplexer 430 is designed to pull down the output node OUT via the first input IN1 or the second input IN2. The second multiplexer 430 includes a left pull-down transistor Mnl and a right pull-down transistor Mnr. The drain of the left pull-down transistor Mnl and the drain of the right pull-down transistor Mpr are connected to the output node OUT. Moreover, the source of the left pull-down transistor Mnl is coupled to the first input IN1 and the source of the right pull-down transistor Mnr is coupled to the second input IN2. The left pull-down transistor Mnl receives as a control input a select signal SEL. The right pull-down transistor Mnr receives as a control input an inverse of the select signal SELB. In some embodiments, the second multiplexer 430 includes an inverter 435 to generate the inverse of the select signal SELB. In other embodiments, the second multiplexer 430 is configured to receive both the select signal SEL and the inverse of the select signal SELB. In some embodiments, the select signal SEL is the first select signal xpd_sel and the inverse of the select signal SELB is the second select signal xpd_selb.

Operation of the Phase Interpolator Cell

Figure 5A:
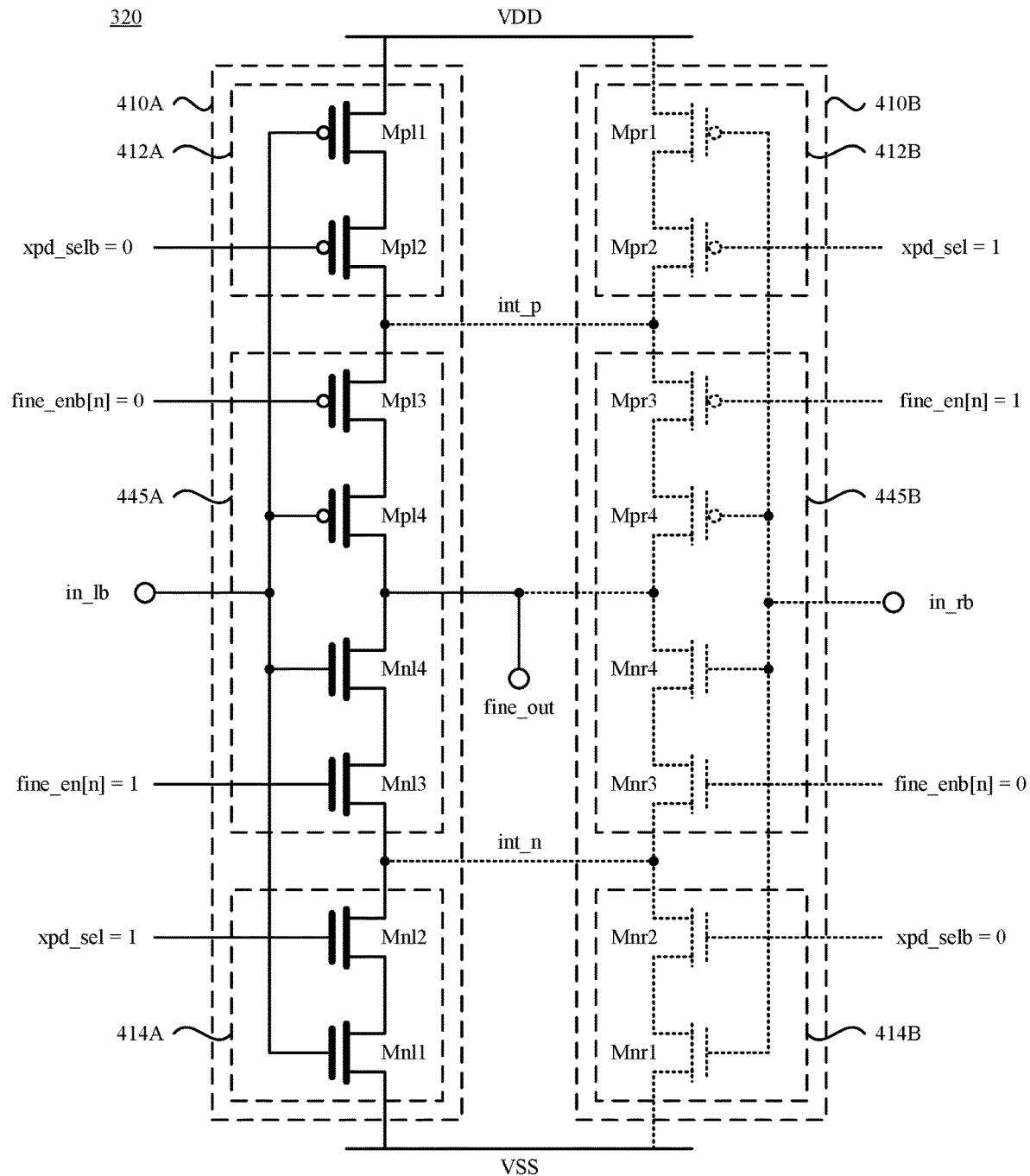
FIG. 5A is a schematic diagram illustrating the operation of a phase interpolator cell in a non-crossed mode, according to one embodiment.

FIG. 5A is a schematic diagram illustrating the operation of a phase interpolator cell in a non-crossed mode, according to one embodiment. In the non-crossed mode, the first select signal xpd_sel has an active value (i.e., has a high logic level) and the first enable signal fine_en is asserted. Moreover, since the second select signal xpd_selb has the inverse Boolean value as the first select signal xpd_sel, the second select signal xpd_selb has an inactive value (i.e., has a low logic level). Similarly, since the second enable signal fine_enb has the inverse Boolean value as the first enable signal fine_eb, the second enable signal fine_enb is unasserted.

In this configuration, the second pull-down transistor Mnl2 of the left branch 410A and the second pull-up transistor Mpl2 of the left branch 410A are turned on, activating the first pull-up network 412A and the first pull-down network 414A of the left branch 410A. Moreover, in this configuration the first tri-state inverter 445A of the left branch 445A is enabled.

In this configuration, the phase interpolator cell 320 acts as an inverter, inverting the first clock signal in_lb to generate the output fine_out. When the first clock signal in_lb has a high logic level, the first pull-down transistor Mnl1 and the fourth pull-down transistor Mnl4 of the left branch 410A are turned on, pulling the voltage level of the output node fine_out to the second power supply voltage level VSS. Conversely, when the first clock signal in_lb has a low logic level, the first pull-up transistor Mpl1 and the fourth pull-up transistor Mpl4 of the left branch 410A are turned on, pulling the voltage level of the output node fine_out to the first power supply voltage level VDD.

Moreover, since the second tri-state inverter 445B, as well as the second pull-up network 412B and the second pull-down network 414B of the right branch 410B are turned off, the second clock signal in_rb does not affect the output node of the phase interpolator cell 320.

Figure 5B:
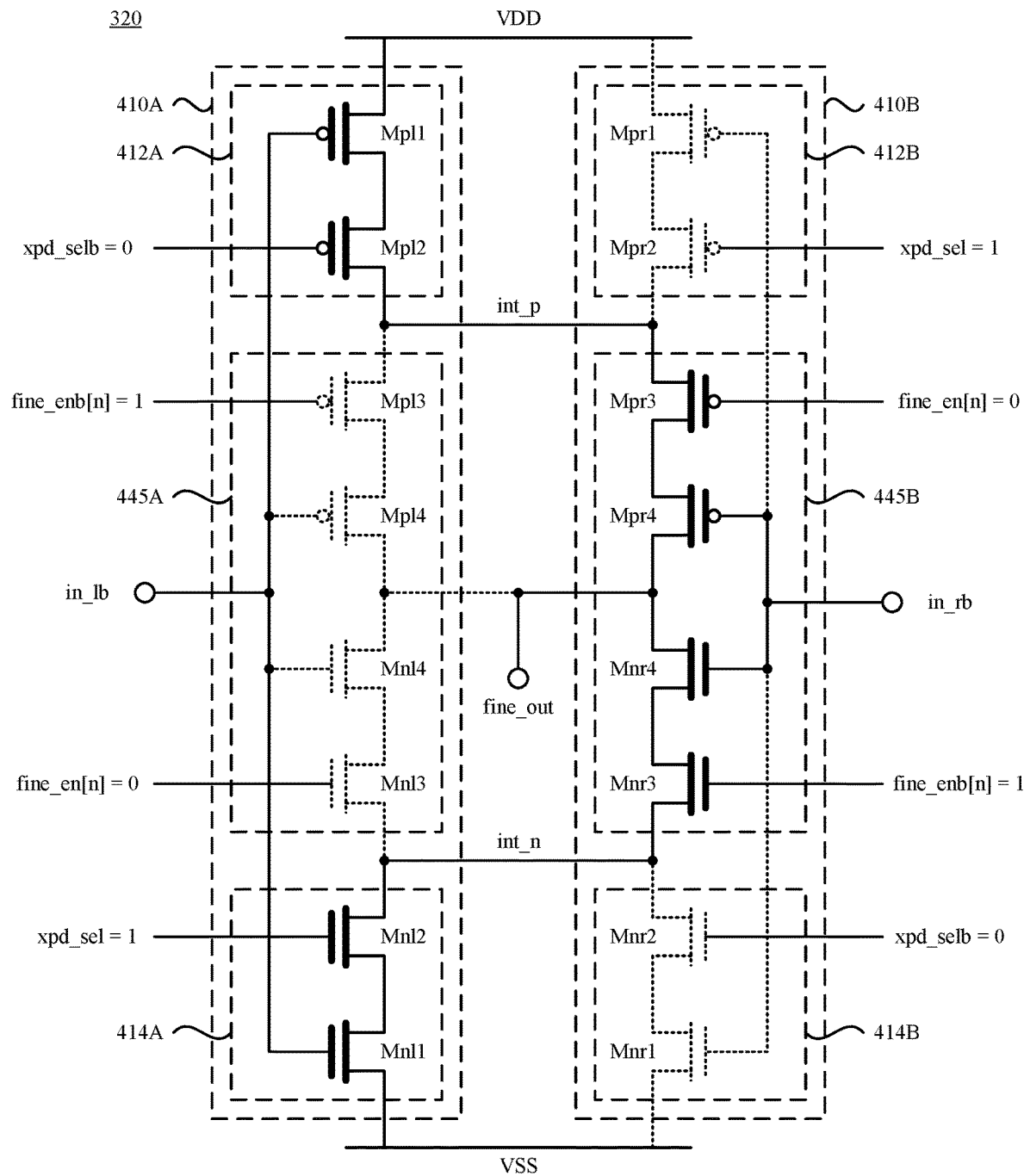
FIG. 5B is a schematic diagram illustrating the operation of a phase interpolator cell in a crossed mode, according to one embodiment.

FIG. 5B is a schematic diagram illustrating the operation of a phase interpolator cell in a crossed mode, according to one embodiment. In the crossed mode, the first select signal xpd_sel has an active value (i.e., has a high logic level) and the first enable signal fine_en is unasserted (i.e., has a low logic level). Moreover, since the second select signal xpd_selb has the inverse Boolean value as the first select signal xpd_sel, the second select signal xpd_selb has an inactive value. Similarly, since the second enable signal fine_enb has the inverse Boolean value as the first enable signal fine_eb, the second enable signal fine_enb is asserted.

In this configuration, the second pull-down transistor Mnl2 of the left branch 410A and the second pull-up transistor Mpl2 of the left branch 410A are turned on, activating the first pull-up network 412A and the first pull-down network 414A of the left branch 410A. Moreover, in this configuration the second tri-state inverter 445B of the right branch 445B is enabled.

In this configuration, the phase interpolator cell 320 acts as an inverter during the periods of time the first clock signal in_lb and the second clock signal in_rb have the same logic level, inverting the first clock signal in_lb to generate the output fine_out. When the second clock signal in_rb has a high logic level, the fourth pull-down transistor Mnr4 of the right branch 410B is turned on. If the first clock signal in_lb has a high logic level, the first pull-down transistor Mnl1 of the left branch 410A is turned on, pulling the voltage level of the output node fine_out to the second power supply voltage level VSS. However, if the first clock signal in_lb has a low logic level, the first pull-down transistor Mnl1 of the left branch 410A is turned off, disconnecting the second intermediate node int_n from the second power supply VSS. As such, the pull-down path is interrupted, causing the output node fine_out to be floated.

Conversely, when the second clock signal in_rb has a low logic level, the fourth pull-up transistor Mpr4 of the right branch 410B is turned on.

If the first clock signal in_lb has a low logic level, the first pull-up transistor Mpl1 of the left branch 410A is turned on, pulling the voltage level of the output node fine_out to the first power supply voltage level VDD. However, if the first clock signal in_lb has a high logic level, the first pull-up transistor Mpl1 of the left branch 410A is turned off, disconnecting the first intermediate node int_p from the first power supply VDD. As such, the pull-up path is interrupted, causing the output node fine_out to be floated.

Figure 6A:
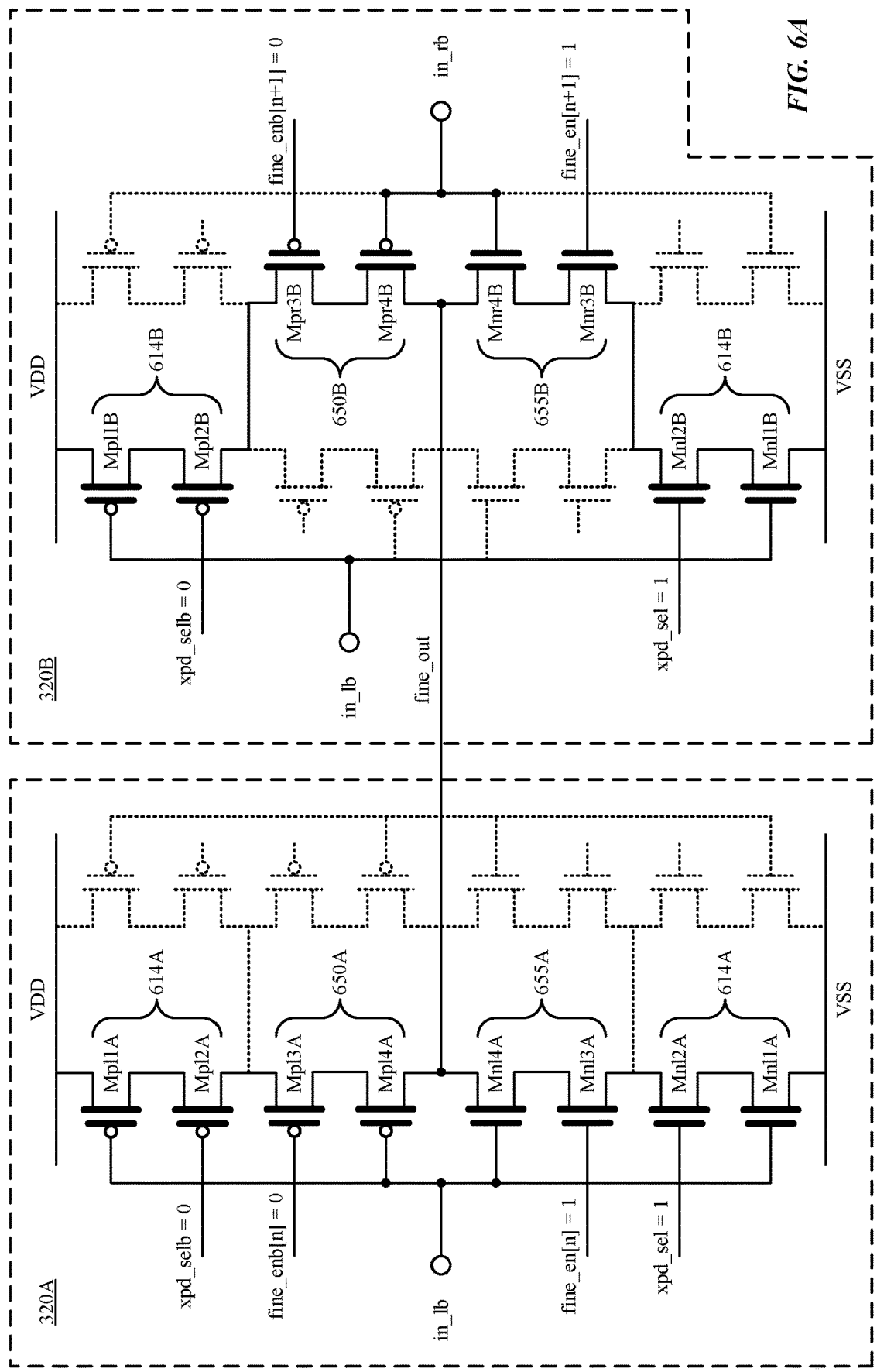
FIG. 6A is a schematic diagram illustrating two phase interpolator cells coupled together, according to one embodiment.

FIG. 6A is a schematic diagram illustrating two phase interpolator cells coupled together, according to one embodiment. In the diagram of FIG. 6A, a first phase interpolator cell 320A is configured in a non-crossed mode and a second phase interpolator cell 320B is configured in a crossed mode. In particular, the diagram of FIG. 6A illustrates a configuration where the select signal has an active value (i.e., when the first clock signal in_lb is leading the second clock signal in_rb). Moreover, in the diagram of FIG. 6A, the n-th phase interpolator cell has a left tri-state inverter enabled (i.e., fine_en[n] is asserted and fine_enb[n] is unasserted), and the (n+1)-th phase interpolator cell has the right tri-state inverter enabled (i.e., fine_en[n+1] is unasserted) and fine_enb[n+1] is asserted).

Figure 6B:
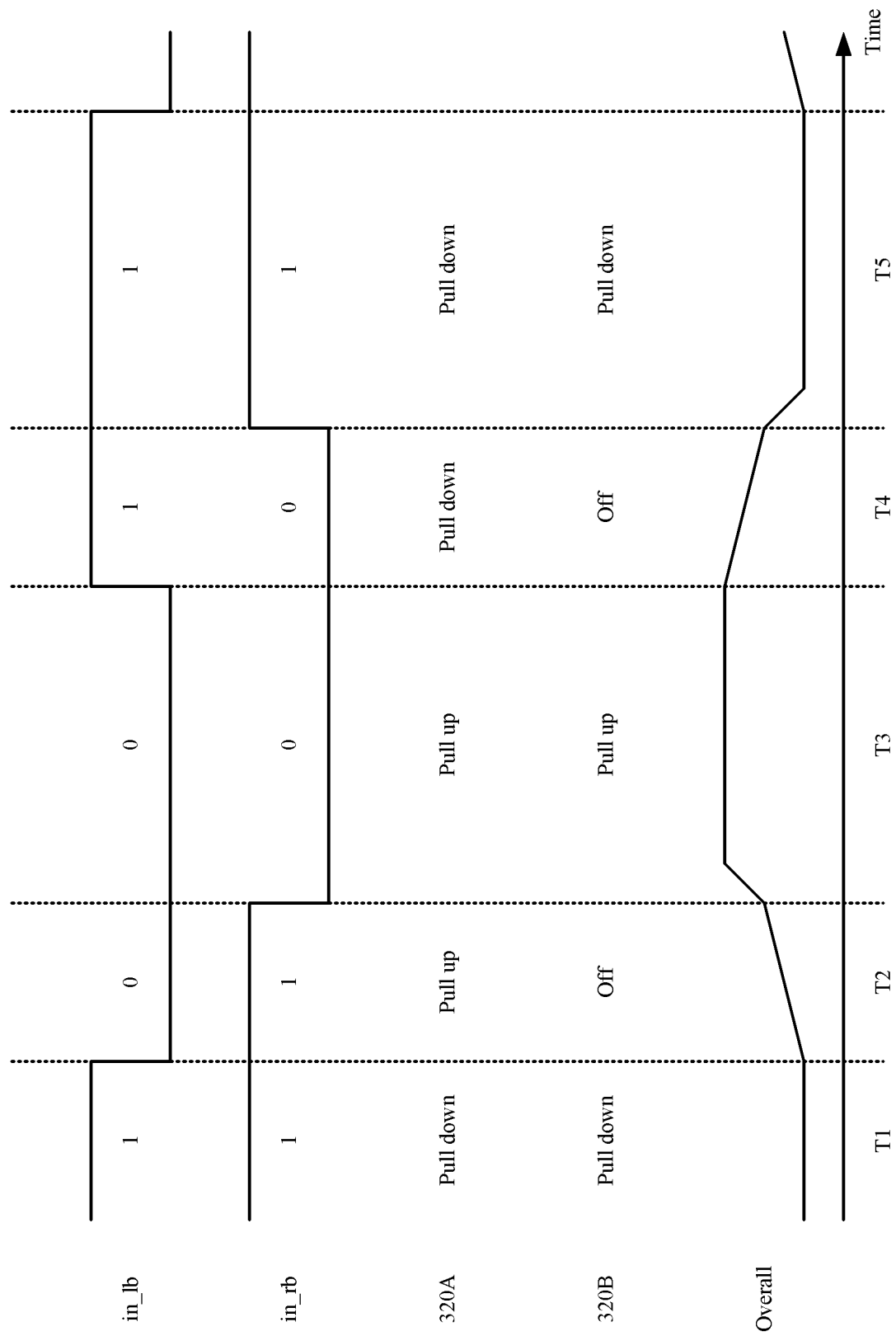
FIG. 6B is a timing diagram illustrating the operation of a phase interpolator cell of FIG. 6A, according to one embodiment.

FIG. 6B is a timing diagram illustrating the operation of a phase interpolator cell of FIG. 6A, according to one embodiment. In this configuration, since the first clock signal in_lb is leading the second clock signal in_rb, there are time periods when the two clock signals have different logic levels. For instance, when the first clock signal in_lb transitions from a low logic level to a high logic level, there is a period of time (T4) when the second clock signal in_rb stays at a low logic level. During this time period, the pull-down network 655A (Mnl3A and Mnl4A) of the left tri-state inverter 445A of the first phase interpolator cell 320A is turned on, while the pull-up network 650B (Mnp3B and Mnp4B) of the right tri-state inverter 445B of the second phase interpolator cell 320B is turned on. Without the additional ability to control the connection between the left tri-state inverter 445A the first phase interpolator cell 320A and the second power supply VSS or the connection between the right tri-state inverter 445B of the second phase interpolator cell 320B and the first power supply VDD, each phase interpolator cell would try to pull the output node fine_out in a different direction.

To prevent the output node fine_out from being coupled to the first power supply VDD and the second power supply VSS at the same time, the first pull-up transistor Mpl1B of the second phase interpolator cell 320B is turned off when the first clock signal in_lb has a high logic level, thus disconnecting the right tri-state inverter 445B of the second phase interpolator cell 320B from the first power supply VDD. As a result, even if the right tri-state inverter 445B is enabled, the right tri-state inverter 445B is unable to pull the output node fine_out to the first power supply voltage VDD.

Similarly, when the first clock signal in_lb transitions from a high logic level to a low logic level, there is a period of time (T2) when the second clock signal in_rb stays at a high logic level. During this time period, the pull-up network 650A (Mpl3A and Mpl4A) on the left tri-state inverter 445A of the first phase interpolator cell 320A is turned on, while the pull-down network 655B (Mnl3B and Mnl4B) of the right tri-state inverter 445B of the second phase interpolator cell 320B is turned on. Without the additional ability to control the connection between the left tri-state inverter 445A the first phase interpolator cell 320A and the first power supply VDD or the connection between the right tri-state inverter 445B of the second phase interpolator cell 320B and the second power supply VSS, each phase interpolator cell would try to pull the output node fine_out in a different direction.

To prevent the output node fine_out from being coupled to the first power supply VDD and the second power supply VSS at the same time, the first pull-down transistor Mnl1B of the second phase interpolator cell 320B is turned off when the first clock signal in_lb has a low logic level, thus disconnecting the right tri-state inverter 445B of the second phase interpolator cell 320B from the second power supply VSS. As a result, even if the right tri-state inverter 445B is enabled, the right tri-state inverter 445B is unable to pull the output node fine_out to the second power supply voltage VSS.

As shown in FIG. 6A, during the first time period T1 and the fifth time period T5, when the first clock signal in_lb and the second clock signal in_rb have a high logic level, the first phase interpolator 320A and the second phase interpolator 320B are configured to pull down the output node fine_out, generating an output having a low logic level.

Moreover, during the third time period, when the first clock signal in_lb and the second clock signal in_rb have a low logic level, the first phase interpolator 320A and the second phase interpolator 320B are configured to pull up the output node fine_out, generating an output having a high logic level.

During the second time period T2, when the first clock signal in_lb has a low logic level and the second clock signal in_rb has a high logic level, the first phase interpolator 320A is configured to pull up the output node fine_out generating an output having a high logic level. Moreover, during this time period, the first pull-down transistor Mnl1B of the second phase interpolator 320B is turned off, turning off the second phase interpolator 320B. Since the number of paths through which the output node is pulled up compared to the third time period T3 is reduced, the output node fine_out is pulled up slower during the second time period T2 than during the third time period T3.

During the fourth time period T4, when the first clock signal in_lb has a high logic level and the second clock signal in_rb has a low logic level, the first phase interpolator 320A is configured to pull down the output node fine_out generating an output having a low logic level. Moreover, during this time period, the first pull-up transistor Mpl1B of the second phase interpolator 320B is turned off, turning off the second phase interpolator 320B. Since the number of paths through which the output node is pulled down compared to the fifth time period T5 is reduced, the output node fine_out is pulled down slower during the fourth time period T4 than during the fifth time period T5.

Figure 7A:
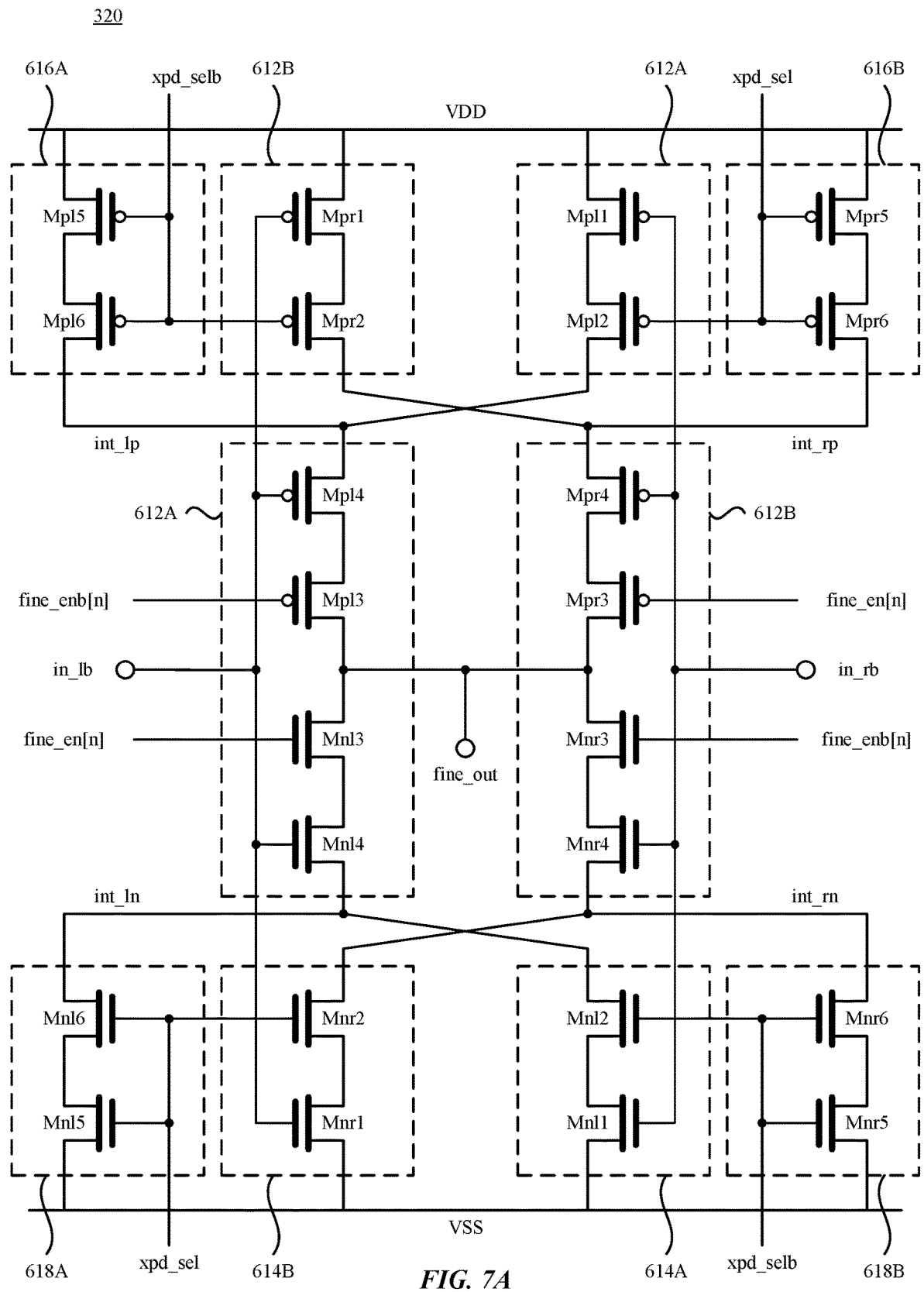
FIG. 7A is a schematic diagram of a phase interpolator cell, according to another embodiment.

FIG. 7A is a schematic diagram of a phase interpolator cell, according to another embodiment. The phase interpolator cell 320 of FIG. 7A includes two branches. The first branch includes a first tri-state inverter 612A, a first pull-up network 612A, a second pull-up network 616A, a first pull-down network 614A, and a second pull-down network 618A. The second branch includes a second tri-state inverter 612B, a third pull-up network 612B, a fourth pull-up network 616B, a third pull-down network 614B, and a fourth pull-down network 618B.

The first pull-up network 612A and the second pull-up network 616A are connected between the first power supply VDD and the first tri-state inverter 612A. The third pull-up network 612B and the fourth pull-up network 616B are connected in between the first power supply VDD and the second tri-state inverter 612B.

The first pull-down network 614A and the second pull-down network 618A are connected between the second power supply VSS and the first tri-state inverter 612A. The third pull-down network 614B and the fourth pull-down network 618B are connected in between the second power supply VSS and the second tri-state inverter 612B.

The first tri-state inverter 612A receives as an input, a first clock signal in_lb and is enabled by a first enable signal fine_en[n]. The second tri-state inverter 612B receives as an input, a second clock signal in_rb and is enabled by a second enable signal fine_enb[n]. In some embodiments, the second enable signal fine_enb[n] is the inverse of the first enable signal fine_en[n].

The first pull-up network 612A includes a pull-up transistor Mpl2 controlled by a first select signal xpd_sel, and a pull-up transistor Mpl1 controlled by the second clock signal in_rb. The second pull-up network 616A includes pull-up transistors Mpl5 and Mpl6 controlled by a second select signal xpd_selb. The first pull-down network 614A includes a pull-down transistor Mnl2 controlled by the second select signal xpd_selb, and a pull-up transistor Mnl1 controlled by the second clock signal in_rb. The second pull-down network 618A includes pull-up transistors Mnl5 and Mnl6 controlled by the first select signal xpd_sel.

When the first tri-state inverter 612A is enabled and the phase interpolator 320 is operated in a non-crossed mode, the second pull-up network 616A and the second pull-down network 618A are selected. In this mode, the phase interpolator 320 inverts the first clock signal in_lb to generate the output fine_out. When the first tri-state inverter 612A is enabled and the phase interpolator 320 is operated in a crossed mode, the first pull-up network 612A and the first pull-down network 614A are selected. In this mode, when the first clock signal in_lb and the second clock signal in_rb have different logic levels, the phase interpolator is turned off and neither the first clock signal in_lb, nor the second clock signal in_rb affect the output fine_out. That is, when the second clock signal in_rb has a high logic level, the first pull-up network 612A is turned off, preventing the first tri-state inverter 612A from pulling the output node fine_out to the first supply voltage VDD. Similarly, when the second clock signal in_rb has a low logic level, the first pull-down network 614A is turned off, preventing the first tri-state inverter 612A from pulling the output node fine_out to the second supply voltage VSS.

The third pull-up network 612B includes a pull-up transistor Mpr2 controlled by the second select signal xpd_selb, and a pull-up transistor Mpr1 controlled by the first clock signal in_lb. The fourth pull-up network 616B includes pull-up transistors Mpr5 and Mpr6 controlled by the first select signal xpd_sel. The third pull-down network 614B includes a pull-down transistor Mnr2 controlled by the first select signal xpd_sel, and a pull-up transistor Mnr1 controlled by the first clock signal in_lb. The fourth pull-down network 618B includes pull-down transistors Mnr5 and Mnr6 controlled by the second select signal xpd_selb.

When the second tri-state inverter 612B is enabled and the phase interpolator 320 is operated in a non-crossed mode, the fourth pull-up network 616B and the fourth pull-down network 618B are selected. In this mode, the phase interpolator 320 inverts the second clock signal in_rb to generate the output fine_out. When the second tri-state inverter 612B is enabled and the phase interpolator 320 is operated in a crossed mode, the third pull-up network 612B and the third pull-down network 614B are selected. In this mode, when the first clock signal in_lb and the second clock signal in_rb have different logic levels, the phase interpolator is turned off and neither the first clock signal in_lb, nor the second clock signal in_rb affect the output fine_out. That is, when the first clock signal in_lb has a high logic level, the third pull-up network 612B is turned off, preventing the second tri-state inverter 612B from pulling the output node fine_out to the first supply voltage VDD. Similarly, when the first clock signal in_lb has a low logic level, the third pull-down network 614B is turned off, preventing the second tri-state inverter 612B from pulling the output node fine_out to the second supply voltage VSS.

Figure 7B:
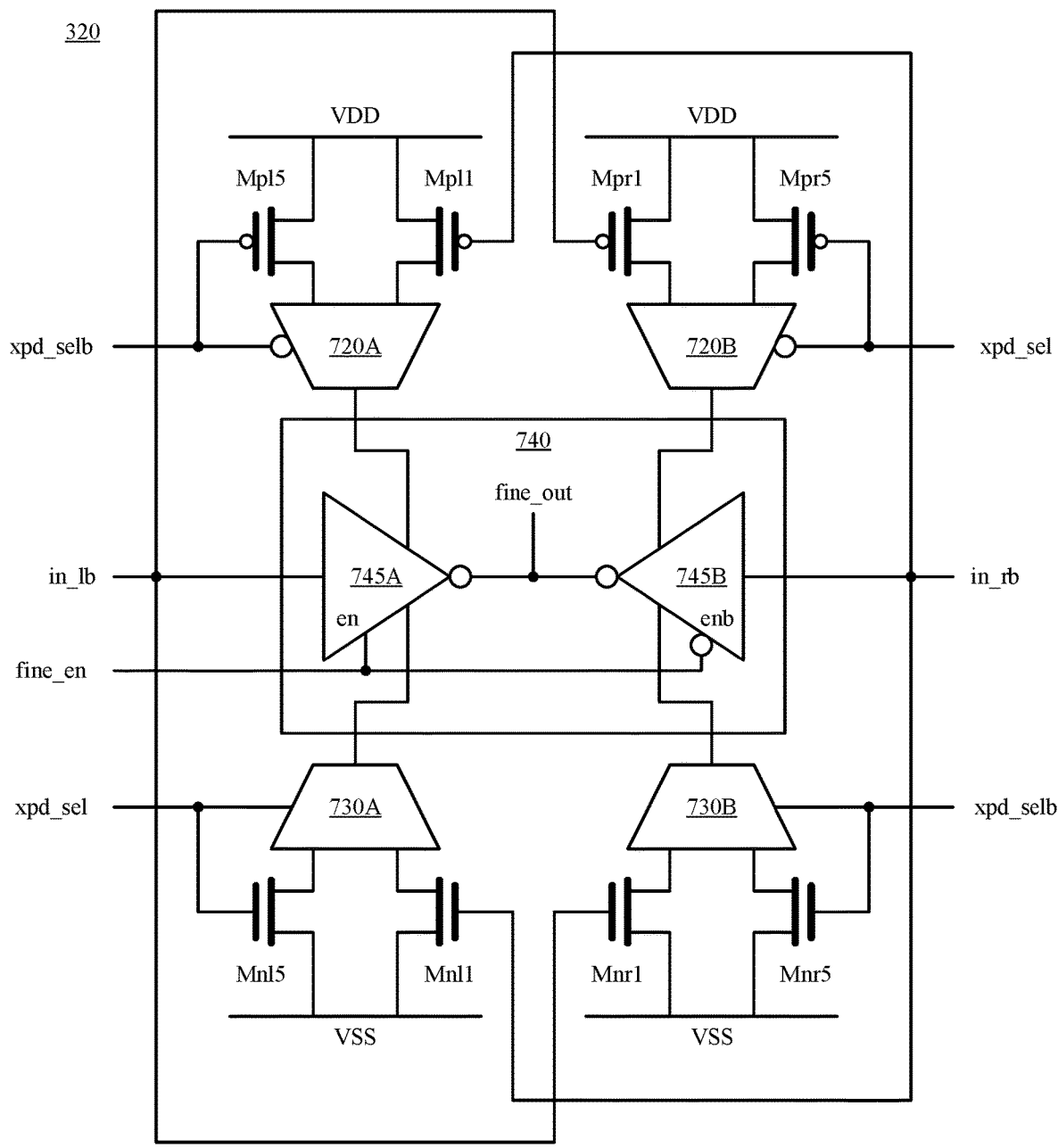
FIG. 7B is a block diagram of the phase interpolator cell of FIG. 7A, according to one embodiment.

FIG. 7B is a block diagram of the phase interpolator cell of FIG. 7A, according to one embodiment. The phase interpolator 320 includes a tri-state inverter pair 740 receiving an enable signal fine_en to select a first tri-state inverter 745A or a second tri-state inverter 745B. The first tri-state inverter 745A receives the first clock signal in_lb as an input. The second tri-state inverter 745B receives the second clock signal in_rb as an input.

A first multiplexer 720A is coupled to a first power supply terminal of the first tri-state inverter 745A. The first multiplexer 720A receives as a control input the second select signal xpd_selb. When the second select signal xpd_selb has a low logic level, the first multiplexer 720A connects the first power supply terminal of the first tri-state inverter 745A to pull-up transistor Mpl5. Pull-up transistor Mpl5 is coupled between the first input of the first multiplexer 720A and the first power supply VDD. Moreover, pull-up transistor Mpl5 is controlled by the second select signal xpd_selb. Since pull-up transistor Mpl5 is controlled by the same signal as the first multiplexer 720A, whenever the first input of the first multiplexer 720A is selected, pull-up transistor Mpl5 is turned on, connecting the first power supply terminal of the first tri-state inverter 745A to the first power supply VDD.

When the second select signal xpd_selb has a high logic level, the first multiplexer 720A connects the first power supply terminal of the first tri-state inverter 745A to pull-up transistor Mpl1. Pull-up transistor Mpl1 is coupled between the second input of the first multiplexer 720A and the first power supply VDD. Moreover, pull-up transistor Mpl1 is controlled by the second clock signal in_rb. When the second clock signal in_rb has a low logic level, pull-up transistor Mpl1 couples the second input of the first multiplexer 720A to the first power supply VDD. Conversely, when the second clock signal in_rb has a high logic level, pull-up transistor Mpl1 is turned off, disconnecting the second input of the first multiplexer 720A from the first power supply VDD.

A second multiplexer 720B is coupled to a first power supply terminal of the second tri-state inverter 745B. The second multiplexer 720B receives as a control input the first select signal xpd_sel. When the first select signal xpd_sel has a low logic level, the second multiplexer 720B connects the first power supply terminal of the first tri-state inverter 745A to pull-up transistor Mpr5. Pull-up transistor Mpr5 is coupled between the first input of the second multiplexer 720B and the first power supply VDD. Moreover, pull-up transistor Mpr5 is controlled by the first select signal xpd_sel. Since pull-up transistor Mpr5 is controlled by the same signal as the second multiplexer 720B, whenever the first input of the second multiplexer 720B is selected, pull-up transistor Mpr5 is turned on, connecting the first power supply terminal of the second tri-state inverter 745B to the first power supply VDD.

When the first select signal xpd_sel has a high logic level, the second multiplexer 720B connects the first power supply terminal of the second tri-state inverter 745B to pull-up transistor Mpr1. Pull-up transistor Mpr1 is coupled between the second input of the second multiplexer 720B and the first power supply VDD. Moreover, pull-up transistor Mpr1 is controlled by the first clock signal in_lb. When the first clock signal in_lb has a low logic level, pull-up transistor Mpr1 couples the second input of the second multiplexer 720B to the first power supply VDD. Conversely, when the first clock signal in_lb has a high logic level, pull-up transistor Mpr1 is turned off, disconnecting the second input of the second multiplexer 720B from the first power supply VDD.

A third multiplexer 730A is coupled to a second power supply terminal of the first tri-state inverter 745A. The third multiplexer 730A receives as a control input the first select signal xpd_sel. When the first select signal xpd_sel has a high logic level, the third multiplexer 730A connects the second power supply terminal of the first tri-state inverter 745A to pull-down transistor Mnl5. Pull-down transistor Mnl5 is coupled between the first input of the third multiplexer 730A and the second power supply VSS. Moreover, pull-down transistor Mnl5 is controlled by the first select signal xpd_sel. Since pull-down transistor Mnl5 is controlled by the same signal as the third multiplexer 730A, whenever the first input of the third multiplexer 730A is selected, pull-down transistor Mnl5 is turned on, connecting the second power supply terminal of the first tri-state inverter 745A to the second power supply VSS.

When the first select signal xpd_sel has a low logic level, the third multiplexer 730A connects the second power supply terminal of the first tri-state inverter 745A to pull-down transistor Mnl1. Pull-down transistor Mnl1 is coupled between the second input of the third multiplexer 730A and the second power supply VSS. Moreover, pull-down transistor Mnl1 is controlled by the second clock signal in_rb. When the second clock signal in_rb has a high logic level, pull-down transistor Mnl1 couples the second input of the third multiplexer 730A to the second power supply VSS. Conversely, when the second clock signal in_rb has a low logic level, pull-down transistor Mnl1 is turned off, disconnecting the second input of the third multiplexer 730A from the second power supply VSS.

A fourth multiplexer 730B is coupled to a second power supply terminal of the second tri-state inverter 745B. The fourth multiplexer 730B receives as a control input the second select signal xpd_selb. When the second select signal xpd_selb has a high logic level, the fourth multiplexer 730A connects the second power supply terminal of the second tri-state inverter 745B to pull-down transistor Mnr5. Pull-down transistor Mnr5 is coupled between the first input of the fourth multiplexer 730B and the second power supply VSS. Moreover, pull-down transistor Mnr5 is controlled by the second select signal xpd_selb. Since pull-down transistor Mnr5 is controlled by the same signal as the fourth multiplexer 730B, whenever the first input of the fourth multiplexer 730B is selected, pull-down transistor Mnr5 is turned on, connecting the second power supply terminal of the second tri-state inverter 745B to the second power supply VSS.

When the second select signal xpd_selb has a low logic level, the fourth multiplexer 730B connects the second power supply terminal of the second tri-state inverter 745B to pull-down transistor Mnr1. Pull-down transistor Mnr1 is coupled between the second input of the fourth multiplexer 730B and the second power supply VSS. Moreover, pull-down transistor Mnr1 is controlled by the first clock signal in_lb. When the first clock signal in_lb has a high logic level, pull-down transistor Mnr1 couples the second input of the fourth multiplexer 730B to the second power supply VSS. Conversely, when the first clock signal in_lb has a low logic level, pull-down transistor Mnr1 is turned off, disconnecting the second input of the fourth multiplexer 730B from the second power supply VSS.

Figure 8:
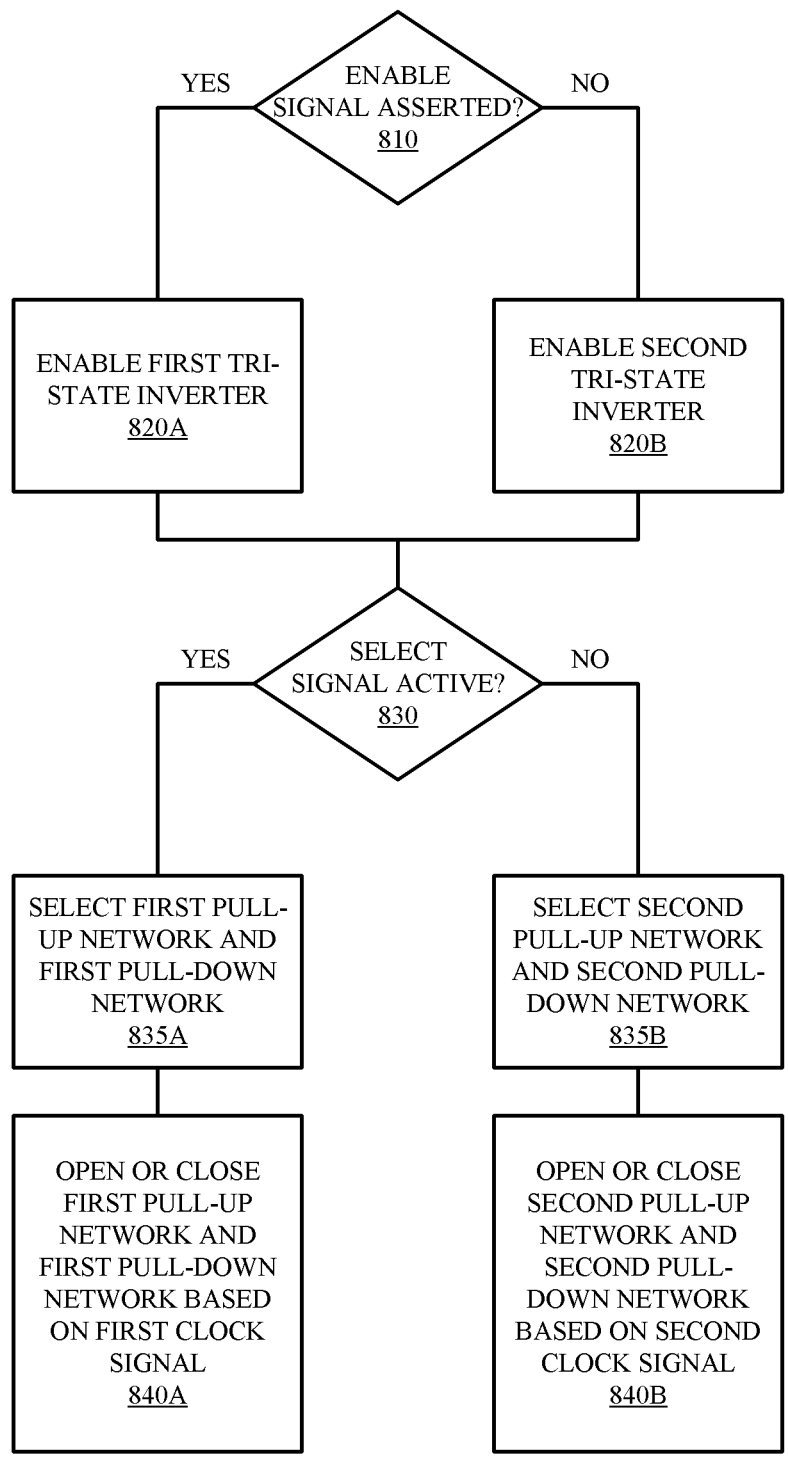
FIG. 8 is a flowchart illustrating a process for operating a phase interpolator cell, according to one embodiment.

FIG. 8 is a flowchart illustrating a process for operating a phase interpolator cell, according to one embodiment. The phase interpolator cell 320 includes a first tri-state inverter 445A and a second tri-state inverter 445B. In some embodiments, the phase interpolator cell 320 determines 810 whether an enable signal fine_en[n] is asserted. If the enable signal fine_en[n] is asserted, the first tri-state inverter 445A is enabled 820A. Otherwise, if the enable signal fine_en[n] is not asserted, the second tri-state inverter 445B is enabled 820B.

Additionally, in some embodiments, the phase interpolator cell 320 determines 830 if a select signal xpd_sel has an active value. If the select signal xpd_sel has an active value, a first pull-up network 412A and a first pull-down network 414A are selected 835A. Moreover, when the first pull-up network 412A and the first pull-down network 414A are selected, the first pull-up network 412A and the first pull-down network 414A are opened or closed 840A based on the logic level of the first clock signal. Conversely, if the select signal xpd_sel has an inactive value, a second pull-up network 412B and a second pull-down network 414B are selected 835B. Moreover, when the second pull-up network 412B and the second pull-down network 414B are selected, the second pull-up network 412B and the second pull-down network 414B are opened or closed 840B based on the logic level of the second clock signal.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A phase interpolator cell, comprising:
   a first tri-state inverter having a control input receiving a first clock signal, an enable input receiving a first enable signal, a first power supply terminal, a second power supply terminal, and an output terminal; and
   a first multiplexer configured to select a first pull-up network when a select signal has an active value, and select a second pull-up network when the select signal has an inactive value, the first multiplexer having:
      a selection input receiving the select signal,
      an output coupled to the first power supply terminal of the first tri-state inverter;
      a first input coupled to the first pull-up network having a first pull-up transistor, the first pull-up transistor having a first terminal coupled to a first power supply and a second terminal coupled to one of the control input of the first-tri-state inverter and the selection input of the first multiplexer,
      a second input coupled to the second pull-up network having a second pull-up transistor, the second pull-up transistor coupled to the first power supply, the second pull-up transistor receiving as a control signal a second clock signal.

2. The phase interpolator cell of claim 1, wherein the first tri-state inverter is configured to couple the output terminal to the first power supply terminal when the first clock signal has a first value and the first enable signal is asserted, couple the output terminal to the second power supply terminal when the first clock signal has a second value and the first enable signal is asserted, and have a floating output when the first enable signal is not asserted.

3. The phase interpolator cell of claim 1, further comprising:
   a second tri-state inverter having a control input receiving the second clock signal different than the first clock signal, an enable input receiving a second enable signal, a first power supply terminal, a second power supply terminal, and an output terminal, the output terminal of the second tri-state inverter coupled to the output terminal of the first tri-state inverter, the second tri-state inverter configured to couple the output terminal to the first power supply terminal when the second clock signal has the first value and the second enable signal is asserted, couple the output terminal to the second power supply terminal when the second clock signal has the second value and the second enable signal is asserted, and have a floating output when the second enable signal is not asserted;
   wherein the output of the first multiplexer is further coupled to the first power supply terminal of the second tri-state inverter.

4. The phase interpolator cell of claim 1, wherein the first pull-up transistor receives as a control signal one of the first clock signal, and the select signal.

5. The phase interpolator cell of claim 1, wherein the first multiplexer further comprises:
   a third pull-up transistor coupled to the first pull-up transistor, the third pull-up transistor receiving as a control signal an inverse of the select signal, the third pull-up transistor configured to couple the first tri-state inverter to the first pull-up network when the select signal has the active value; and
   a fourth pull-up transistor coupled to the second pull-up transistor, the fourth pull-up transistor receiving as a control signal the select signal, the fourth pull-up transistor configured to couple the first tri-state inverter to the second pull-up network when the select signal has the inactive value.

6. The phase interpolator cell of claim 1, further comprising:
   a second multiplexer configured to select a first pull-down network when the select signal has the active value, and select a second pull-down network when the select signal has the inactive value, the second multiplexer coupled to the second power supply terminal of the first tri-state inverter, the second multiplexer having:
      a first input coupled to the first pull-down network having a first pull-down transistor, the first pull-down transistor coupled to a second power supply, the first pull-down transistor receiving as a control signal the first clock signal,
      a second input coupled to the second pull-down network having a second pull-down transistor, the second pull-down transistor coupled to the second power supply, the second pull-down transistor receiving as a control signal the second clock signal, and
      a selection input, the selection input receiving the select signal.

7. The phase interpolator cell of claim 6, wherein the second multiplexer further comprises:
   a third pull-down transistor coupled to the first pull-down transistor, the third pull-down transistor receiving as a control signal the select signal; and a fourth pull-down transistor coupled to the second pull-down transistor, the fourth pull-down transistor receiving as a control signal an inverse of the select signal.

8. The phase interpolator cell of claim 1, wherein the select signal has a first value if the first clock signal leads the second clock signal, and has a second value if the first clock signal lags the second clock signal.

9. The phase interpolator cell of claim 1, wherein the first tri-state inverter further comprises:
a fifth pull-up transistor receiving the first clock signal as a control signal;
a sixth pull-up transistor coupled to the fifth pull-up transistor, the sixth pull-up transistor receiving an inverse of the first enable signal as a control signal;
a fifth pull-down transistor receiving the first clock signal as a control signal, the fifth pull-down transistor coupled to the fifth pull-up transistor; and
a sixth pull-down transistor coupled to the fifth pull-down transistor, the sixth pull-down transistor receiving the first enable signal as a control signal.

10. The phase interpolator cell of claim 1, wherein the first tri-state inverter further comprises:
a fifth pull-up transistor receiving the first clock signal as a control signal;
a sixth pull-up transistor coupled to the fifth pull-up transistor, the sixth pull-up transistor receiving an inverse of the first enable signal as a control signal;
a fifth pull-down transistor receiving the first clock signal as a control signal; and
a sixth pull-down transistor coupled to the fifth pull-down transistor, the sixth pull-down transistor receiving the first enable signal as a control signal, the sixth pull-down transistor further coupled to the sixth pull-up transistor.

11. A phase interpolator cell, comprising:
a pull-up network comprising:
a first pull-up transistor receiving a first clock signal as an input;
a second pull-up transistor receiving an enable signal as an input, a drain of the second pull-up transistor coupled to a source of the first pull-up transistor;
a third pull-up transistor receiving a select signal as an input, a drain of the third pull-up transistor coupled to a source of the second pull-up transistor;
a fourth pull-up transistor receiving a second clock signal as an input, a drain of the fourth pull-up transistor coupled to a source of the third pull-up transistor;
a fifth pull-up transistor receiving an inverse of the select signal as an input, a drain of the fifth pull-up transistor coupled to the source of the second pull-up transistor.

12. The phase interpolator cell of claim 11, wherein the pull-up network further comprises:
a sixth pull-up transistor receiving the first clock signal as an input, a drain of the sixth pull-up transistor coupled to a source of the fifth pull-up transistor.

13. The phase interpolator cell of claim 12, wherein a source of the sixth pull-up transistor and a source of the fourth pull-up transistor are coupled to a first power supply.

14. The phase interpolator cell of claim 11, wherein the pull-up network further comprises:
a sixth pull-up transistor receiving the select signal as an input, a drain of the sixth pull-up transistor coupled to a source of the fifth pull-up transistor.

15. The phase interpolator cell of claim 14, wherein a source of the sixth pull-up transistor and a source of the fourth pull-up transistor are coupled to a first power supply.

16. The phase interpolator cell of claim 11, further comprising:
a pull-down network comprising:
a first pull-down transistor receiving the first clock signal as an input;
a second pull-down transistor receiving an inverse of the enable signal as an input, a drain of the second pull-down transistor coupled to a source of the first pull-down transistor;
a third pull-down transistor receiving the inverse of the select signal as an input, a drain of the third pull-down transistor coupled to a source of the second pull-down transistor;
a fourth pull-down transistor receiving the second clock signal as an input, a drain of the fourth pull-down transistor coupled to a source of the third pull-down transistor;
a fifth pull-down transistor receiving the select signal as an input, a drain of the fifth pull-down transistor coupled to a source of the second pull-down transistor.

17. A method for generating an output clock signal comprising:
enabling a first tri-state inverter when a first enable signal is asserted, the first tri-state inverter receiving as an input a first clock signal and enabling a second tri-state inverter when a second enable signal is asserted, the second tri-state inverter receiving as an input a second clock signal;
selecting a first pull-up network when a select signal has an active value and selecting a second pull-up network when the select signal has an inactive value, the first pull-up network coupling a power supply terminal of the first tri-state inverter and a power supply terminal of the second tri-state inverter when the first pull-up network is closed, the second pull-up network coupling the power supply terminal of the first tri-state inverter and the power supply terminal of the second tri-state inverter when the second pull-up network is closed.

18. The method of claim 17, further comprising:
closing the first pull-up network when the first clock signal has a low value and opening the first pull-up network when the first clock signal has a high value; and
closing the second pull-up network when the second clock signal has a low value and opening the second pull-up network when the second clock signal has a high value.

19. The method of claim 17, further comprising:
closing the first pull-up network when the first clock signal has a low value and opening the first pull-up network when the first clock signal has a high value; and
closing the second pull-up network when the second clock signal has a low value and opening the second pull-up network when the second clock signal has a high value.

20. The method of claim 17, further comprising:
closing the first pull-up network when the select signal has a low value and opening the first pull-up network when the select signal has a high value; and
closing the second pull-up network when the second clock signal has a low value and opening the second pull-up network when the second clock signal has a high value.

\* \* \* \* \*